United States Patent
Choi et al.

(10) Patent No.: US 12,426,305 B2
(45) Date of Patent: Sep. 23, 2025

(54) SEMICONDUCTOR DEVICE INCLUDING TRANSISTOR HAVING SOURCE/DRAIN CONTRACT WITH CONVEX CURVED SURFACE

(71) Applicant: Samsung Electronics Co., Ltd., Suwon-si (KR)

(72) Inventors: Seung Hoon Choi, Yongin-si (KR); Ja Eung Koo, Yongin-si (KR); Il Young Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 708 days.

(21) Appl. No.: 17/685,909

(22) Filed: Mar. 3, 2022

(65) Prior Publication Data
US 2023/0053379 A1  Feb. 23, 2023

(30) Foreign Application Priority Data
Aug. 18, 2021  (KR) .......................... 10-2021-0108752

(51) Int. Cl.
*H10D 30/67* (2025.01)
*H10D 62/10* (2025.01)
*H10D 64/01* (2025.01)

(52) U.S. Cl.
CPC ..... *H10D 30/6729* (2025.01); *H10D 30/6757* (2025.01); *H10D 62/121* (2025.01); *H10D 64/01* (2025.01)

(58) Field of Classification Search
CPC ......... H01L 29/41733; H01L 29/42392; H01L 29/775; H01L 29/401; H01L 21/7684; H01L 23/5283; H10D 30/6729; H10D 30/6757; H10D 62/121; H10D 64/01; H10D 84/0149
See application file for complete search history.

(56) References Cited

U.S. PATENT DOCUMENTS

| | | | |
|---|---|---|---|
| 7,397,131 B2 | 7/2008 | Kim et al. | |
| 8,779,510 B2 | 7/2014 | Yilmaz et al. | |
| 9,257,529 B2 | 2/2016 | Metz | |
| 10,332,984 B2 | 6/2019 | Choi et al. | |

(Continued)

FOREIGN PATENT DOCUMENTS

KR  20050059400 A  6/2005

OTHER PUBLICATIONS

Examination issued on Dec. 9, 2022 in European Application No. 22173463.5.

(Continued)

*Primary Examiner* — Changhyun Yi
(74) *Attorney, Agent, or Firm* — MORGAN, LEWIS & BOCKIUS LLP

(57) ABSTRACT

There is provided a semiconductor device capable of improving the performance and reliability of a device. The semiconductor device includes comprising a gate structure including a gate electrode and a gate capping pattern on an upper surface of the gate electrode; a source/drain pattern on at least one side of the gate structure; and a source/drain contact on and connected with an upper surface of the source/drain pattern, the source/drain contact extending along a sidewall of the gate electrode, wherein an upper surface of the source/drain contact includes a convex curved surface.

17 Claims, 39 Drawing Sheets

(56) References Cited

U.S. PATENT DOCUMENTS

| | | |
|---|---|---|
| 10,593,765 B2 | 3/2020 | Chew et al. |
| 2008/0160759 A1 | 7/2008 | Lee et al. |
| 2017/0288015 A1* | 10/2017 | Smith .................. H10D 62/151 |
| 2019/0148225 A1* | 5/2019 | Chen ................. H01L 21/76849 |
| | | 257/384 |
| 2020/0286781 A1* | 9/2020 | Hsieh ................ H01L 21/76879 |
| 2021/0020500 A1 | 1/2021 | Chung et al. |
| 2021/0098368 A1* | 4/2021 | Yu ..................... H01L 21/76852 |
| 2021/0104612 A1 | 4/2021 | Bae et al. |
| 2021/0126134 A1* | 4/2021 | Ferng ................ H01L 21/30604 |
| 2021/0217749 A1 | 7/2021 | Lee et al. |
| 2022/0102202 A1* | 3/2022 | Hsiung ............. H01L 21/76826 |
| 2022/0254927 A1* | 8/2022 | Cheng .............. H01L 21/76897 |
| 2022/0310398 A1* | 9/2022 | Lin ..................... H01L 29/0847 |

OTHER PUBLICATIONS

European Search Report issued on Nov. 28, 2022 in European Application No. 22173463.5.

* cited by examiner

SEMICONDUCTOR DEVICE INCLUDING TRANSISTOR HAVING SOURCE/DRAIN CONTRACT WITH CONVEX CURVED SURFACE

CROSS-REFERENCE TO RELATED APPLICATION

This application claims priority from Korean Patent Application No. 10-2021-0108752 filed on Aug. 18, 2021, in the Korean Intellectual Property Office and all the benefits accruing therefrom under 35 U.S.C. 119, the contents of which in its entirety are herein incorporated by reference.

BACKGROUND

Technical Field

The present disclosure relates to a semiconductor device.

Description of the Related Art

As a solution for increasing the density of a semiconductor device, a multi-gate transistor for forming a multi-channel active pattern (and/or silicon body) of a fin and/or nanowire shape on a substrate and forming a gate on a surface of the multi-channel active pattern has been suggested.

Since this multi-gate transistor uses a three-dimensional channel, it is easy to scale the multi-gate transistor. Also, even though a gate length of the multi-gate transistor is not increased, a current control capability may be improved. In addition, a short channel effect (SCE) in which a potential of a channel area is affected by a drain voltage may be suppressed effectively.

Meanwhile, as a pitch size of a semiconductor device is reduced, studies for reducing capacitance and making sure of electrical stability between contacts in the semiconductor device will be required.

SUMMARY

An object of some of the example embodiments of the present disclosure is to provide a semiconductor device that may improve element performance and reliability.

The objects of the present disclosure are not limited to those mentioned above and additional objects of the present disclosure, which are not mentioned herein, will be clearly understood by those skilled in the art from the following descriptions of the present disclosure.

According to an aspect of the present disclosure, there is provided a semiconductor device comprising a gate structure including a gate electrode and a gate capping pattern on an upper surface of the gate electrode; a source/drain pattern on at least one side of the gate structure; and a source/drain contact on and connected with an upper surface of the source/drain pattern, the source/drain contact extending along a sidewall of the gate electrode, wherein an upper surface of the source/drain contact includes a convex curved surface.

According to another aspect of the present disclosure, there is provided a semiconductor device comprising a gate structure including a gate electrode and a gate capping pattern on an upper surface of the gate electrode; a source/drain pattern on at least one side of the gate structure; and a source/drain contact on and connected with an upper surface of the source/drain pattern, wherein at least a portion of the source/drain contact protrudes above an upper surface of the gate capping pattern, and the upper surface of the gate capping pattern includes a concave curved surface.

According to still another aspect of the present disclosure, there is provided a semiconductor device comprising an active pattern including a lower pattern and a sheet pattern on the lower pattern; a gate structure on the active pattern, the gate structure including a gate electrode and a gate capping pattern, the gate electrode surrounding the sheet pattern, and the gate capping pattern on an upper surface of the gate electrode; a source/drain pattern on at least one side of the gate structure; a source/drain contact on and connected with an upper surface of the source/drain pattern; and a gate contact passing through the gate capping pattern and connecting with the gate electrode, wherein a portion of the source/drain contact and a portion of the gate contact protrude above an upper surface of the gate capping pattern an upper surface of the source/drain contact includes a convex curved surface.

BRIEF DESCRIPTION OF THE DRAWINGS

The above and other aspects and features of the present disclosure will become more apparent by describing exemplary embodiments thereof in detail with reference to the attached drawings, in which:

FIG. 5 is an enlarged view illustrating a portion P of FIG. 2a;

DETAILED DESCRIPTION OF THE EMBODIMENTS

Figure 1:
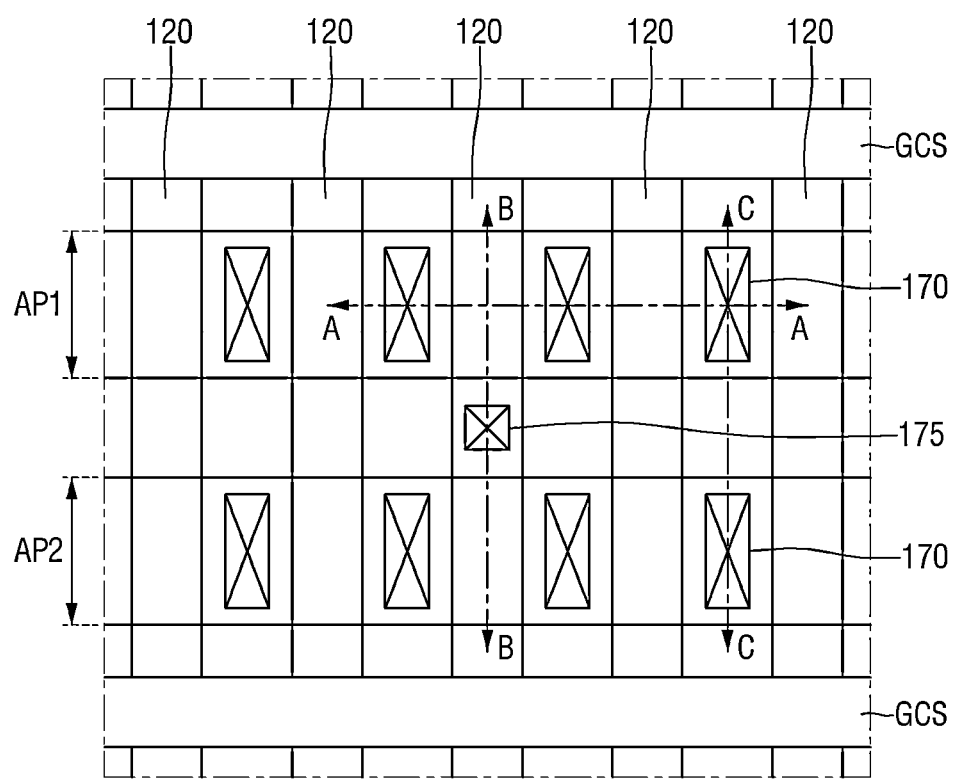
FIG. 1 is an example layout view illustrating a semiconductor device according to some embodiments.

Hereinafter, example embodiments will be described in detail with reference to the accompanying drawings, wherein like reference numerals refer to like elements throughout. In the description, spatially relative terms such as "lower", "upper," "above," "under," etc. may be used herein for ease of description to describe one element's relationship to another element, e.g., as shown in the figures. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

As shown, a semiconductor device according to some embodiments of the present disclosure includes, but is not limited to, a fin-type transistor (FinFET) including a channel area of a fin-type pattern shape, a transistor including a nano wire and/or a nano sheet, and a multi-bridge channel field effect transistor (MBCFET™) by way of example. The embodiments are not, however, so limited, and the semiconductor device according to some embodiments may include a tunneling transistor (e.g., tunneling FET) and/or a three-dimensional (3D) transistor. The semiconductor device according to some embodiments may include a planar transistor. In addition, the technical spirits of the present disclosure may be applied to two-dimensional (2D) material based transistors (FETs) and/or a heterogeneous structure thereof.

In addition, the semiconductor device according to some embodiments may include a bipolar junction transistor, a lateral double diffusion transistor (LDMOS), and/or the like.

The semiconductor device according to some embodiments will be described with reference to FIGS. 1 to 6.

Figure 2A:
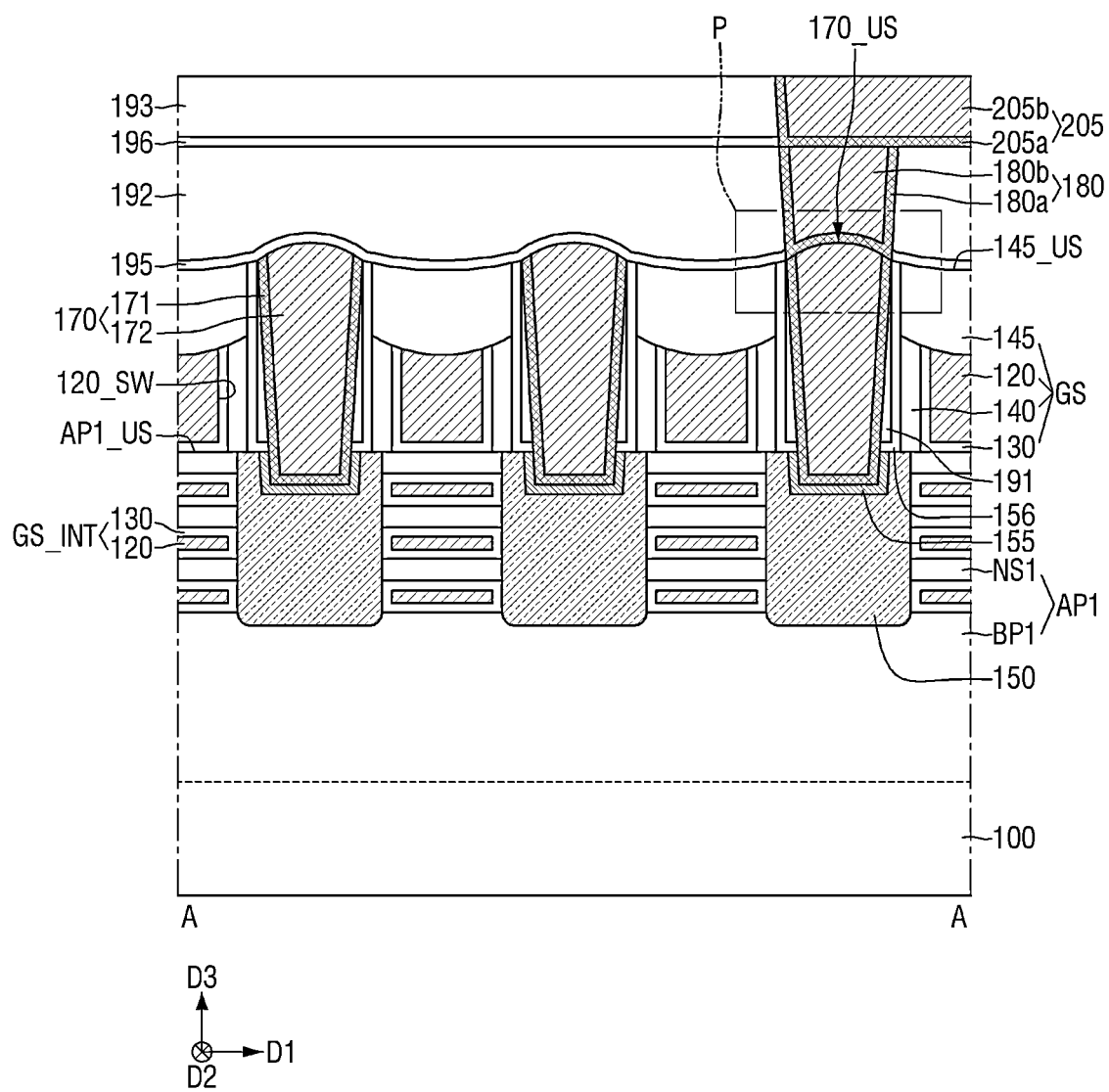
FIGS. 2a and 2b are cross-sectional views taken along line A-A of FIG. 1.
Figure 2B:
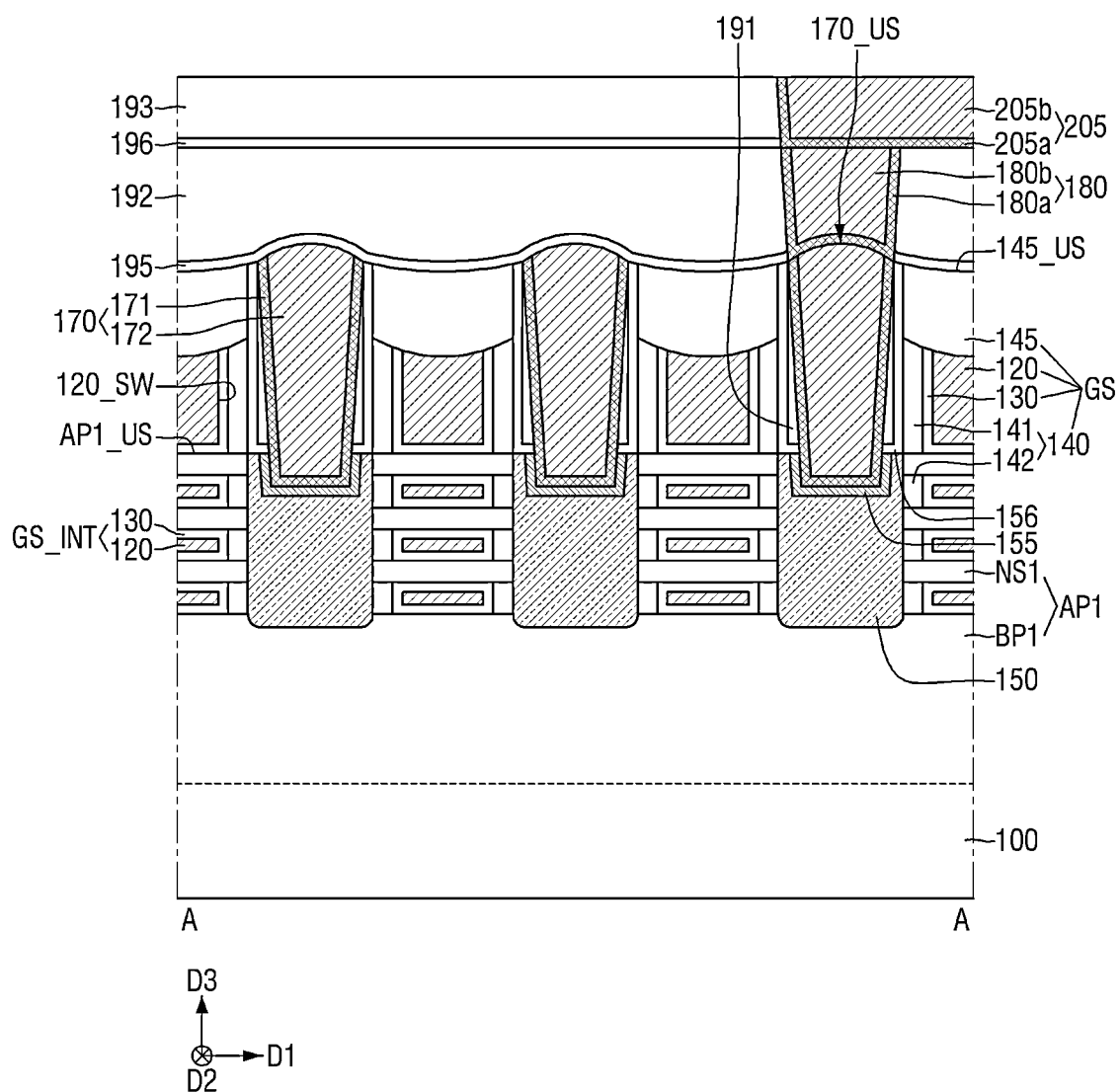
Figure 3:
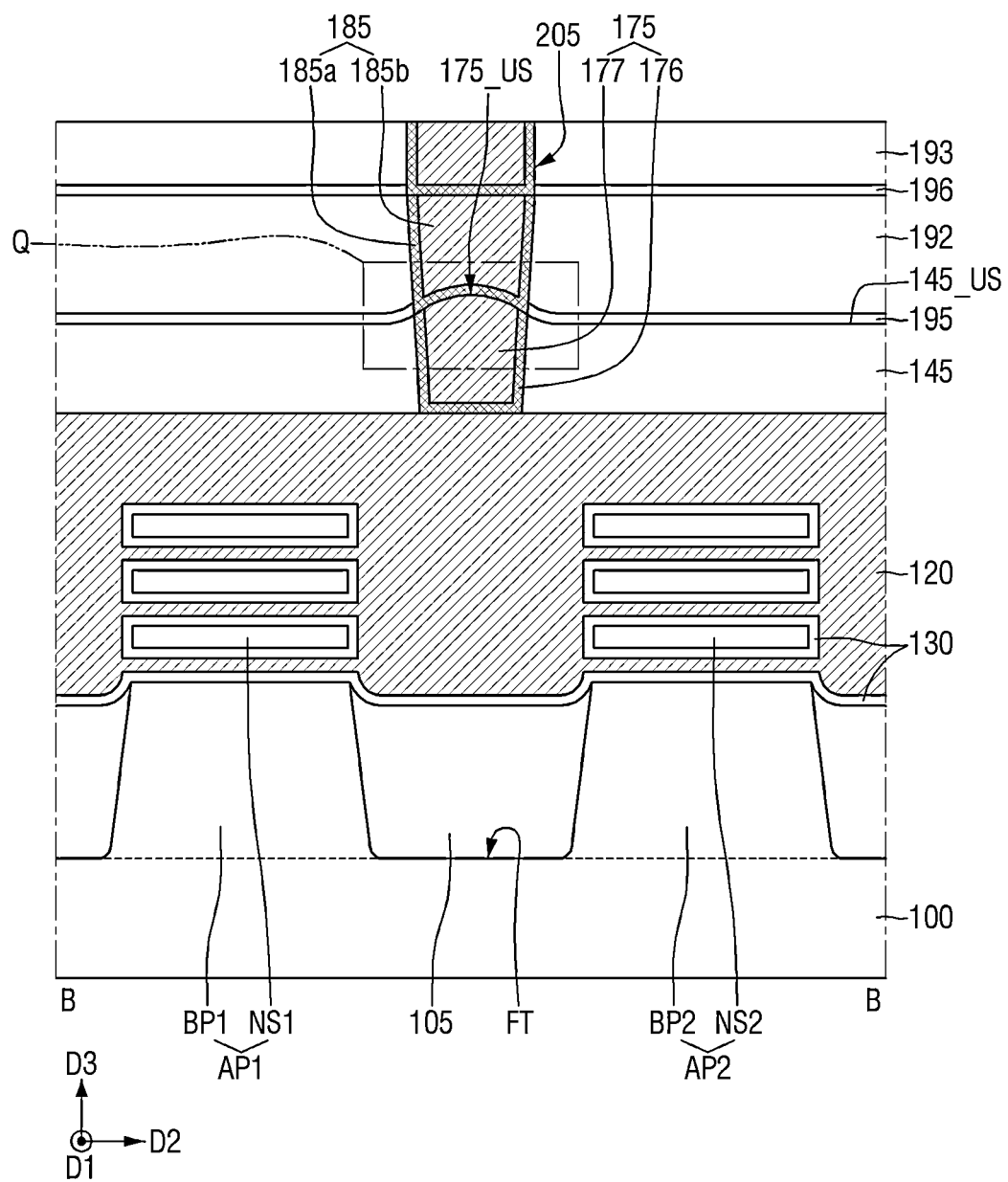
FIG. 3 is a cross-sectional view taken along line B-B of FIG. 1.
Figure 4:
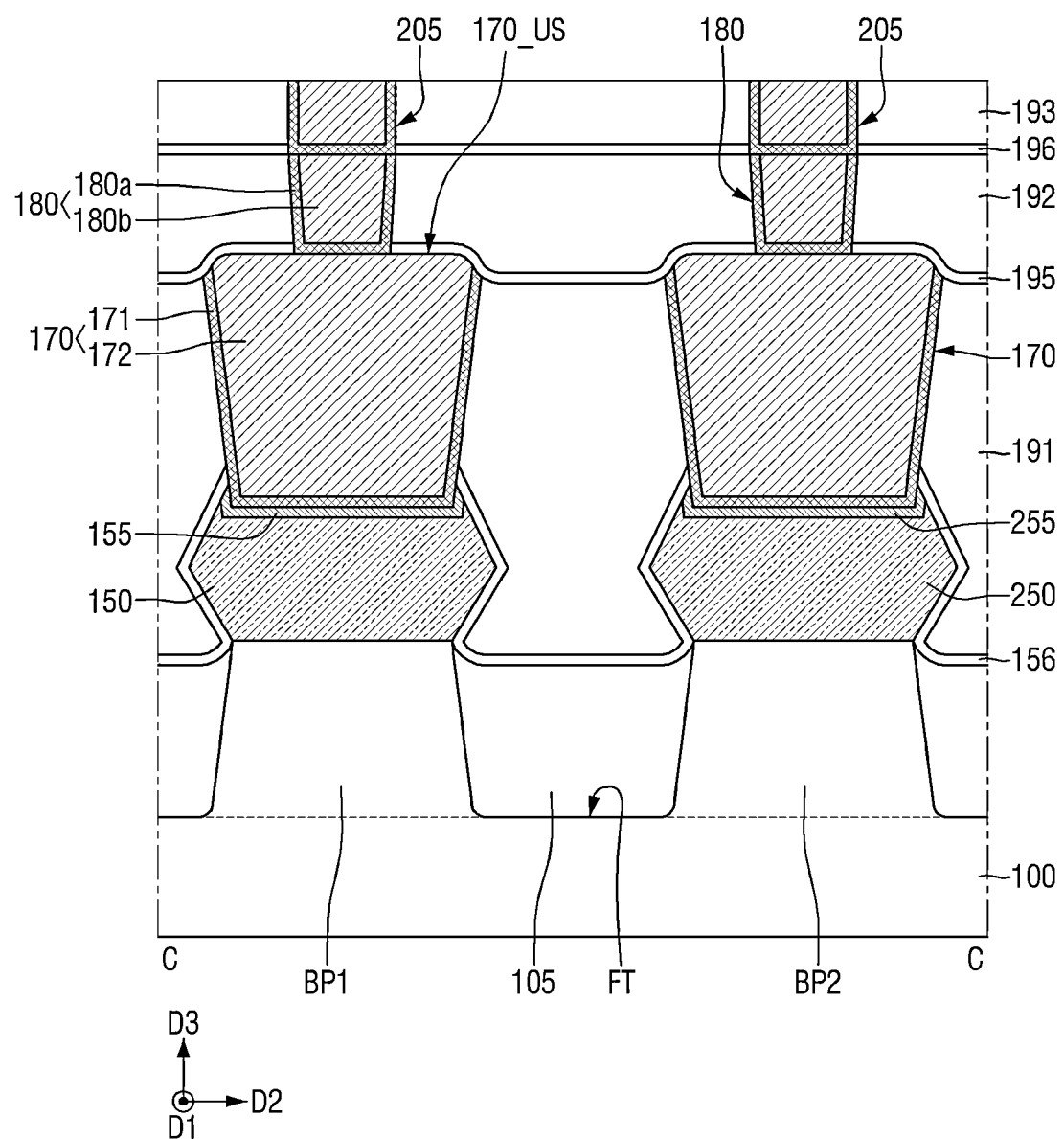
FIG. 4 is a cross-sectional view taken along line C-C of FIG. 1.
Figure 5:
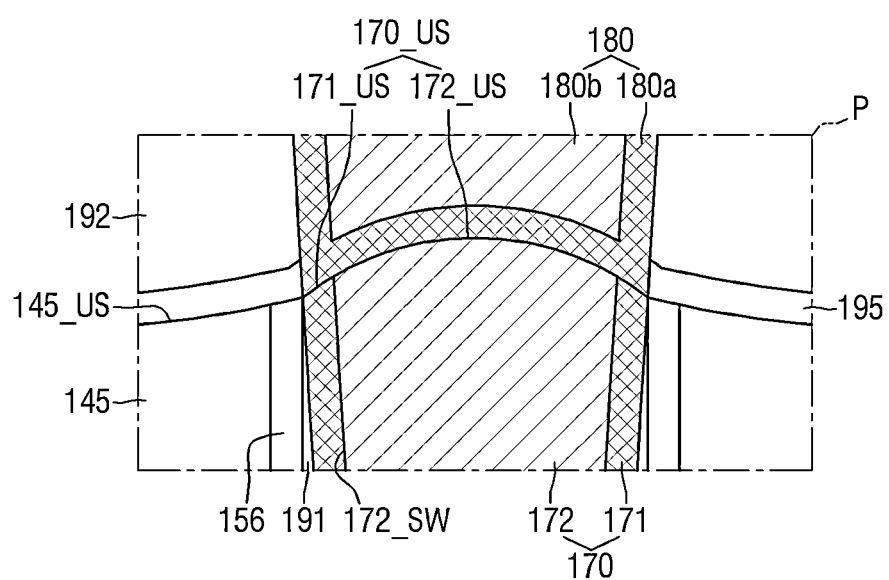
Figure 6:
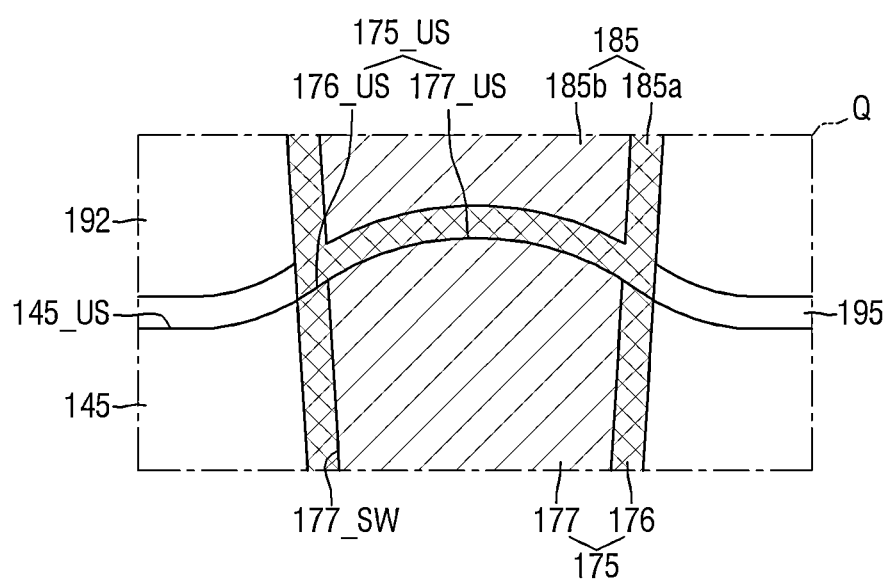
FIG. 6 is an enlarged view illustrating a portion Q of FIG. 3.

FIG. 1 is an example layout view illustrating a semiconductor device according to some embodiments. FIGS. 2a and 2b are cross-sectional views taken along line A-A of FIG. 1. FIG. 3 is a cross-sectional view taken along line B-B of FIG. 1. FIG. 4 is a cross-sectional view taken along line C-C of FIG. 1. FIG. 5 is an enlarged view illustrating a portion P of FIG. 2a. FIG. 6 is an enlarged view illustrating a portion Q of FIG. 3.

For convenience of description, a source/drain via plug 180, a gate via plug 185, and a wiring line 205 are not shown in FIG. 1. Also, although a gate contact 175 is illustrated as disposed on one of a plurality of first gate electrodes 120, this is only an example of the example embodiments, and the example embodiments are not limited thereto.

Referring to FIGS. 1 to 6, the semiconductor device according to some embodiments may include a first active pattern AP1, a second active pattern AP2, at least one first gate electrode 120, a source/drain contact 170, a gate contact 175, a source/drain via plug 180, a gate via plug 185, and a wiring line 205.

The semiconductor device may include a substrate 100. The substrate 100 may be a semiconductor substrate, and/or may be a bulk silicon and/or a silicon-on-insulator (SOD. Otherwise, the substrate 100 may be a silicon substrate, and/or may include other material such as silicon germanium, silicon germanium on insulator (SGOI), indium antimonide, lead telluride compound, indium arsenide, indium phosphide, gallium arsenide, gallium antimonide, and/or the like, but is not limited thereto.

The first active pattern AP1 and the second active pattern AP2 may be disposed on the substrate 100. The first active pattern AP1 and the second active pattern AP2 may each be extended to be long in a first direction D1. The first active pattern AP1 and the second active pattern AP2 may be disposed to be spaced apart from each other in a second direction D2. For example, the first direction D1 may a direction crossing the second direction D2.

In some example embodiments, at least one of the first active pattern AP1 and/or the second active pattern AP2 may be a p-channel metal-oxide-semiconductor ("PMOS") forming area and/or n-channel metal-oxide-semiconductor ("NMOS") forming area. For example, one of the first active pattern AP1 or the second active pattern AP2 may be the PMOS and the other may be the NMOS forming area. In another example, the first active pattern AP1 and the second active pattern AP2 may both be NMOS forming areas. In other example, the first active pattern AP1 and the second active pattern AP2 may both be PMOS forming areas.

The first active pattern AP1 and the second active pattern AP2 may be disposed in a logic and/or a memory area. For example, the first active pattern AP1 and/or the second active pattern AP2 may be disposed in a static random-access memory ("SRAM") area; and/or the first active pattern AP1 and/pr the second active pattern AP2 may be disposed in an input/output ("I/O") area.

The first active pattern AP1 and the second active pattern AP2 may be, for example, multi-channel active patterns. The first active pattern AP1 may include a first lower pattern BP1 and a plurality of first sheet patterns NS1. The second active pattern AP2 may include a second lower pattern BP2 and a plurality of second sheet patterns NS2.

Each of the first lower pattern BP1 and the second lower pattern BP2 may protrude from the substrate 100. Each of the first and second lower patterns BP1 and BP2 may be extended to be long in the first direction D1.

The first lower pattern BP1 may be spaced apart from the second lower pattern BP2 in the second direction D2. The first lower pattern BP1 and the second lower pattern BP2 may be separated from each other by a fin trench FT extended in the first direction D1.

The plurality of first sheet patterns NS1 may be disposed on an upper surface of the first lower pattern BP1. The plurality of first sheet patterns NS1 may be spaced apart from the first lower pattern BP1 in a third direction D3. Respective first sheet patterns NS1 may also be spaced apart from each other in the third direction D3. The third direction D3 may be a direction crossing the first direction D1 and the second direction D2. For example, the third direction D3 may be a thickness direction of the substrate 100. The first direction D1 may be a direction crossing the second direction D2.

The plurality of second sheet patterns NS2 may be disposed on an upper surface of the second lower pattern BP2. The plurality of second sheet patterns NS2 may be spaced apart from the second lower pattern BP2 in the third direction D3. The respective second sheet patterns NS2 may also be spaced apart from each other in the third direction D3.

Although the first sheet pattern NS1 and the second sheet pattern NS2 are shown as respectively including three sheet patterns stacked in the third direction D3, the example embodiments are not limited thereto. For example, the first and second sheet pattern NS1 and NS2 may include fewer and/or more sheet patterns.

The first lower pattern BP1 and the second lower pattern BP2 may be formed by etching a portion of the substrate 100 and/or may include an epitaxial layer grown from the substrate 100. In some example embodiments, the first lower pattern BP1 and the second lower pattern BP2 may comprise the same material as the substrate 100. For example, each of the first and second lower patterns BP1 and BP2 may include silicon and/or germanium, (which are an elemental semiconductor material); and/or the first lower pattern BP1 may include a compound semiconductor, such as a group IV-IV compound semiconductor and/or a group III-V compound semiconductor.

The group IV-IV compound semiconductor may be a binary compound and/or ternary compound, which includes at least two of carbon (C), silicon (Si), germanium (Ge) and/or tin (Sn), and/or a compound including at least two of carbon (C), silicon (Si), germanium (Ge), and/or tin (Sn), which are doped with a group IV element.

The group III-V compound semiconductor may be, for example, one of a binary compound, a ternary compound and/or a quaternary compound, which is formed by combination of at least one of aluminum (Al), gallium (Ga), and/or indium (In) (which are group III elements) and at least one of phosphorus (P), arsenic (As) and/or antimony (Sb) (which are group V elements).

Each of the first sheet pattern NS1 and the second sheet pattern NS2 may include, e.g., one of an elemental semiconductor (e.g., silicon and/or germanium), a group IV-IV compound semiconductor, and/or a group III-V compound semiconductor. The first sheet pattern NS1 may include the same material as that of the first lower pattern BP1 and/or may include a material different from that of the first lower pattern BP1. Likewise, the second sheet pattern NS2 may include the same material as that of the second lower pattern BP2 and/or may include a material different from that of the second lower pattern BP2.

In some example embodiments, the first and second lower patterns BP1 and BP2 may include silicon and may be referred to as silicon lower patterns, and/or the first and second sheet patterns NS1 and NS2 may include silicon and may be referred to as silicon sheet patterns.

In some example embodiments, a width of the first sheet pattern NS1 in the second direction D2 may be increased or reduced in proportion to a width of the first lower pattern BP1 in the second direction D2. For example, although the widths of the first sheet patterns NS1 in the second direction D2 are shown as being uniform, this is only or convenience of description and the example embodiments are not limited thereto. For example, unlike the shown example, the widths of the first sheet patterns NS1 in the second direction D2 may be reduced based on, e.g., the distance away from the first lower pattern BP1.

The field insulating layer 105 may be formed on the substrate 100 and may fill at least a portion of the fin trench FT.

For example, the field insulating layer 105 may be disposed on a sidewall of the first lower pattern BP1 and a sidewall of the second lower pattern BP2. The field insulating layer 105 may be, for example, not disposed on the upper surface of the first lower pattern BP1 and the upper surface of the second lower pattern BP2.

In some example embodiments, the field insulating layer 105 may entirely cover the sidewall of the first lower pattern BP1, but the example embodiments are not limited thereto. For example, unlike the shown example, the field insulating layer 105 may cover a portion of the sidewall of the first lower pattern BP1. In this case, a portion of the first lower pattern BP1 may protrude in the third direction D3 past an upper surface of the field insulating layer 105.

Each of the first sheet pattern NS1 and the second sheet pattern NS2 is disposed to be higher than the upper surface of the field insulating layer 105. The field insulating layer 105 may include, for example, an insulator such as an oxide layer, a nitride layer, an oxynitride layer, and/or a combination layer thereof. Although the field insulating layer 105 is shown as a single layer, this is only for convenience of description and the example embodiments are not limited thereto. For example, the field insulating layer 105 may include one or more layers.

At least one gate structure GS may be disposed on the substrate 100. For example, at least one gate structure GS may be disposed on the field insulating layer 105. The gate structure GS may be extended in the second direction D2. Adjacent gate structures GS may be spaced apart from each other in the first direction D1.

The gate structure GS may be disposed on the first active pattern AP1 and the second active pattern AP2. The gate structure GS may cross the first active pattern AP1 and the second active pattern AP2.

Although the gate structure GS is shown as being disposed over the first active pattern AP1 and the second active pattern AP2, this is only for convenience of description and the example embodiments are not limited thereto. For example, a portion of the gate structure GS may be divided into two portions, and then may be disposed, respectively, on the first active pattern AP1 and the second active pattern AP2.

The gate structure GS may cross the first lower pattern BP1 and the second lower pattern BP2. The gate structure GS may surround the first sheet pattern NS1 and the second sheet pattern NS2.

The gate structure GS may include a first gate electrode 120, a first gate insulating layer 130, a first gate spacer 140, and a gate capping pattern 145.

The gate structure GS may include an inter-gate structure GS_INT disposed between the first sheet patterns NS1 adjacent to each other in the third direction and between the first lower pattern BP1 and the first sheet pattern NS1. The inter-gate structure GS_INT may include a first gate electrode 120 and a first gate insulating layer 130, which are disposed between the adjacent first sheet patterns NS1 and between the first lower pattern BP1 and the first sheet pattern NS1. Although not shown, the inter-gate structure GS_INT may also be disposed between the second sheet patterns NS2 adjacent to each other in the third direction D3 and between the second lower pattern BP2 and the second sheet pattern NS2.

For example, the first gate electrode 120 may be disposed on the first lower pattern BP1 and the second lower pattern BP2. The first gate electrode 120 may cross the first lower pattern BP1 and the second lower pattern BP2. The first gate electrode 120 may surround the first sheet pattern NS1. The first gate electrode 120 may surround the second sheet pattern NS2.

An upper surface of the first gate electrode 120 may be a concave curved surface that is recessed toward an upper surface AP1_US of the first active pattern, For example, the upper surface AP1_US of the first active pattern may be an upper surface of the first sheet pattern NS1 disposed at the uppermost portion of the first sheet pattern NS1. However, the example embodiments are not limited thereto. For example, unlike the shown example, the upper surface of the first gate electrode 120 may be a flat plane.

The first gate electrode 120 may include a conductive material. For example, the conductive material may be (and/or include) at least one of a metal, a metal alloy, a conductive metal nitride, a conductive metal carbide, a conductive metal carbonitride, a metal silicide, a doped semiconductor material, a conductive metal oxide, and/or a conductive metal oxynitride. For example, the first gate electrode 120 may include, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), a combination thereof, and/or the like. The conductive metal oxide and the conductive metal oxynitride may include, but are not limited to, conductive oxidized forms of the materials described above.

The first gate electrode 120 may be disposed on both sides of a first source/drain pattern 150 that will be described later. The gate structure GS may be disposed on both sides of the first source/drain pattern 150 in, e.g., the first direction D1.

For example, in some example embodiments, the first gate electrodes 120 disposed on both sides of the first source/drain pattern 150 may be normal gate electrodes used as gates of transistors. In some example embodiments, the first gate electrode 120 disposed on one side of the first source/drain pattern 150 may be used as a gate of a transistor, but the first gate electrode 120 disposed on the other side of the first source/drain pattern 150 may be a dummy gate electrode.

Although not shown, the first gate electrode 120 may be disposed on both sides of a second source/drain pattern 250 that will be described later. The gate structure GS may be disposed on both sides of the second source/drain pattern 250 in the first direction D1.

The first gate insulating layer 130 may be extended along the upper surface of the field insulating layer 105, the upper surface of the first lower pattern BP1, and the upper surface of the second lower pattern BP2. The first gate insulating layer 130 may also surround the first sheet pattern NS1. The first gate insulating layer 130 may also surround the second sheet pattern NS2. For example, the first gate insulating layer 130 may be disposed around the first sheet pattern NS1 and around the second sheet pattern NS2. The first gate electrode 120 is disposed on the first gate insulating layer 130. For example, the first gate insulating layer 130 may be disposed between the first gate electrode 120 and the first sheet pattern NS1 and between the first gate electrode 120 and the second sheet pattern NS2.

The first gate insulating layer 130 may an insulating material. For example, the insulating material may include at least one of silicon oxide, silicon oxynitride, silicon nitride, and/or a high dielectric constant material. Herein a high dielectric constant material may refer to a material having a dielectric constant greater than that of silicon oxide. The high dielectric constant material may, e.g., include one (or more) of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Although the first gate insulating layer 130 is shown as a single layer, this is only for convenience of description and the example embodiments are not limited thereto. For example, the first gate insulating layer 130 may include a plurality of layers. The first gate insulating layer 130 may include an interfacial layer disposed between the first sheet pattern NS1 and the first gate electrode 120 and/or between the second sheet pattern NS2 and the first gate electrode 120, and a high dielectric constant insulating layer.

The semiconductor device, according to some embodiments, may include a negative capacitance (NC) FET based on a negative capacitor. For example, the first gate insulating layer 130 may include a ferroelectric material layer having ferroelectric characteristics and/or a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance is reduced compared to the capacitance of each individual capacitor. On the other hand, when at least one of capacitances of two or more capacitors connected in series has a negative value, the total capacitance may have a positive value and may be greater than an absolute value of each individual capacitance.

Therefore, when a ferroelectric material layer having a negative capacitance and a paraelectric material layer having a positive capacitance are connected in series, the total capacitance value of the ferroelectric material layer and the paraelectric material layer connected in series may be increased. Based on the increased total capacitance value, a transistor having a ferroelectric material layer may have a subthreshold swing (SS) less than 60 mV/decade at a room temperature.

The ferroelectric material layer may include a material having ferroelectric characteristics. For example, the material having ferroelectric characteristics may include at least one of hafnium oxide, hafnium zirconium oxide, barium strontium titanium oxide, barium titanium oxide, and/or lead zirconium titanium oxide. The material having ferroelectric characteristics may be doped with a dopant to, e.g., improve at least one characteristic of the material and/or to promote a material phase having the ferroelectric characteristics. For example, the dopant may include at least one of aluminum (Al), titanium (Ti), niobium (Nb), lanthanum (La), zirconium (Zr), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn).

A type of the dopant included in the ferroelectric material layer may be varied depending on the ferroelectric material of the ferroelectric material layer. For example, when the ferroelectric material layer includes hafnium oxide, the dopant included in the ferroelectric material layer may include at least one of gadolinium (Gd), silicon (Si), zirconium (Zr), aluminum (Al), and/or yttrium (Y). For example, the material having ferroelectric characteristics may be hafnium zirconium oxide, which may be a material including hafnium oxide (HfO) doped with zirconium (Zr) and/or a compound of hafnium (Hf), zirconium (Zr), oxygen (O).

The amount of dopant may be less than the amount of another constituent and/or constituents. For example, when the compound is hafnium oxide (HfO) and the dopant is aluminum (Al), the ferroelectric material layer may include a ratio of aluminum of 3 at % to 8 at % (atomic %). In this case, a ratio of the dopant may be a ratio of, e.g., aluminum to a sum of hafnium and, e.g., aluminum.

When the dopant is silicon (Si), the ferroelectric material layer may include a ratio of silicon of 2 at % to 10 at %. When the dopant is yttrium (Y), the ferroelectric material layer may include a ratio of yttrium of 2 at % to 10 at %. When the dopant is gadolinium (Gd), the ferroelectric material layer may include a ratio of gadolinium of 1 at % to 7 at %. When the dopant is zirconium (Zr), the ferroelectric material layer may include zirconium of 50 at % to 80 at %.

The paraelectric material layer may include a material having paraelectric characteristics. The paraelectric material may include, for example, at least one of silicon oxide and/or a metal oxide having a high dielectric constant. The metal oxide included in the paraelectric material layer may include, but is not limited to, at least one of hafnium oxide, zirconium oxide, and/or aluminum oxide.

The ferroelectric material layer and the paraelectric material layer may include the same material. Although the ferroelectric material layer and the paraelectric material layer may include the same material, the ferroelectric material layer may have the ferroelectric characteristics while the paraelectric material layer may not have the ferroelectric characteristics. For example, when the ferroelectric material layer and the paraelectric material layer both include hafnium oxide, a crystal structure of the hafnium oxide included in the ferroelectric material layer may be different from that of the hafnium oxide included in the paraelectric material layer.

The ferroelectric material layer may have a thickness having ferroelectric characteristics. For example, the ferroelectric material layer may have a thickness at and/or greater than a threshold thickness for the ferroelectric characteristics. In some example embodiments, for example, the thickness of the ferroelectric material layer may be 0.5 nm to 10 nm, but the example embodiments are not limited thereto. For example, since a threshold thickness indicating ferroelectric characteristics may be varied depending on each ferroelectric material, the thickness of the ferroelectric material layer may be varied depending on the ferroelectric material.

In some example embodiments, the first gate insulating layer 130 may include one ferroelectric material layer and/or may include a plurality of ferroelectric material layers spaced apart from each other. The first gate insulating layer 130 may have a deposited layer structure in which a plurality of ferroelectric material layers and a plurality of paraelectric material layers are alternately deposited.

A gate isolation structure GCS may separate the first gate electrodes 120 aligned in the second direction D2. Although the gate isolation structure GCS is illustrated as cutting the plurality of first gate electrodes 120 adjacent to each other in the first direction D1, it is only for convenience of description and the example embodiments are not limited thereto. The gate isolation structure GCS may include an insulating material.

First gate spacer 140 may be disposed on a sidewall 120_SW of the gate electrode. The first gate spacer 140 may be extended in the second direction D2.

In FIG. 2a, the first gate spacer 140 is not disposed between the first sheet patterns NS1 adjacent to each other in the third direction D3 and between the first sheet pattern NS1 and the first lower pattern BP1. The first gate spacer 140 may include only an outer spacer.

In FIG. 2b, the first gate spacer 140 may be disposed between the first sheet patterns NS1 adjacent to each other in the third direction D3 and between the first sheet pattern NS1 and the first lower pattern BP1. The first gate spacer 140 may include an outer spacer 141 and an inner spacer 142. The inner spacer 142 may be disposed between the first sheet patterns NS1 adjacent to each other in the third direction D3 and between the first sheet pattern NS1 and the first lower pattern BP1. The inner spacer 142 may be in contact with the first gate insulating layer 130 of the intergate structure GS_INT.

The first gate spacer 140 may include an insulating material. The insulating material may be (and/or include) at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), their combination, and/or the like.

Although not shown, in FIG. 1, the cross-sectional view taken along the second active pattern AP2 may be similar to one of FIGS. 2a and 2b.

The gate capping pattern 145 may be disposed on an upper surface of the first gate electrode 120 and an upper surface of the first gate spacer 140. Unlike the shown example, the gate capping pattern 145 may also be disposed between the first gate spacers 140.

In the semiconductor device according to some embodiments, an upper surface 145_US of the gate capping pattern 145 may include a curved surface. For example, the upper surface 145_US of the gate capping pattern 145 may include a concave curved surface. The upper surface 145_US of the gate capping pattern 145 may include a curved surface that is recessed toward an upper surface AP1_US of the first active pattern. The concave curved surface of the gate capping pattern 145 may, for example, coincide with the concave curved surface of the first gate electrode 120.

For example, in at least a portion of the gate capping pattern 145, a height of the upper surface 145_US of the gate capping pattern 145 based on the upper surface AP1_US of the first active pattern is lowered as the gate capping pattern 145 becomes farther away from the source/drain contact 170 and the gate contact 175.

The gate capping pattern 145 may include an insulating material. The insulating material may be (and/or include) at least one of, for example, silicon nitride (SiN), silicon oxynitride (SiON), silicon oxide (SiO$_2$), silicon carbonitride (SiCN), silicon oxycarbonitride (SiOCN), their combination, and/or the like.

The first source/drain pattern 150 may be formed on the first active pattern AP1. The first source/drain pattern 150 may be disposed on the first lower pattern BP1. The first source/drain pattern 150 may be disposed on a side of the gate structure GS. The first source/drain pattern 150 may be disposed between the gate structures GS.

The first source/drain pattern 150 may be disposed on at least one side of the gate structure GS. For example, the first source/drain pattern 150 may be disposed on both sides of the gate structure GS. Unlike the shown example, the first source/drain pattern 150 may also be disposed on one side of the gate structure GS and may not be disposed on the other side of the gate structure GS.

The second source/drain pattern 250 may be disposed on the second lower pattern BP2. Although not shown, a shape of the second source/drain pattern 250 disposed on the second lower pattern BP2 may be similar to a shape in which the first source/drain pattern 150 is disposed in FIGS. 2a and 2b.

Each of the first source/drain pattern 150 and the second source/drain pattern 250 may include an epitaxial pattern. The first source/drain pattern 150 and the second source/drain pattern 250 may include, for example, a semiconductor material.

The first source/drain pattern 150 may be included in a source/drain of a transistor that uses the first active pattern AP1, for example, the first sheet pattern NS1 as a channel area. The second source/drain pattern 250 may be included in a source/drain of a transistor that uses the second sheet pattern NS2 as a channel area.

A source/drain etch stop layer 156 may be disposed on the upper surface of the field insulating layer 105, a sidewall of the gate structure GS, an upper surface of the first source/drain pattern 150, a sidewall of the first source/drain pattern 150, an upper surface of the second source/drain pattern 250, and a sidewall of the second source/drain pattern 250.

The source/drain etch stop layer 156 may include a material having an etch selectivity with respect to a first interlayer insulating layer 191 that will be described later. The source/drain etch stop layer 156 may include an insulating material such as at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), their combination, and/or the like. However, the example embodiments are not limited thereto, and, unlike the shown example, the source/drain etch stop layer 156 may not be formed.

The first interlayer insulating layer 191 may be formed on the field insulating layer 105. The first interlayer insulating layer 191 may be disposed on the first source/drain pattern 150 and the second source/drain pattern 250.

In the semiconductor device according to some embodiments, the first interlayer insulating layer 191 may not cover the upper surface 145_US of the gate capping pattern.

In the semiconductor device according to some embodiments, an upper surface of the first interlayer insulating layer 191 may include a concave curved surface. For example, the upper surface of the first interlayer insulating layer 191 may include a curved surface recessed toward the field insulating layer 105.

In at least a portion of the first interlayer insulating layer 191, a height of the upper surface of the first interlayer insulating layer 191 based on the upper surface of the field insulating layer 105 is lowered as the first interlayer insulating layer 191 becomes far away from the source/drain contact 170.

The first interlayer insulating layer 191 may include an insulating material. The insulating material may be (and/or include) at least one of, for example, silicon oxide, silicon nitride, silicon oxynitride, and/or a low dielectric constant material. For example, the low dielectric constant material may include, but is not limited to, Fluorinated TetraEthyl-OrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams (such as polypropylene oxide), Carbon Doped silicon Oxide (CDO), Organo Silicate Glass (OSG), silicon low-K (SiLK), Amorphous Fluorinated Carbon, silica aerogels, silica xerogels, mesoporous silica, their combination, and/or the like.

The source/drain contact 170 may be disposed on the first active pattern AP1 and the second active pattern AP2. The source/drain contact 170 may be disposed on the first source/drain pattern 150. The source/drain contact 170 may be connected with the first source/drain pattern 150 on the first active pattern APE The source/drain contact 170 may be extended in the third direction D3 along the sidewall 120_SW of the gate electrode.

Also, the source/drain contact 170 may be disposed on the second source/drain pattern 250. The source/drain contact 170 may be connected with the second source/drain pattern 250 on the second active pattern AP2.

Unlike the shown example, a portion of the source/drain contact 170 connected with the first source/drain pattern 150 may directly be connected with the source/drain contact 170 connected with the second source/drain pattern 250. For example, in the semiconductor device according to some embodiments, at least one source/drain contact 170 may be disposed over the first active pattern AP1 and the second active pattern AP2.

The source/drain contact 170 may be disposed in the first interlayer insulating layer 191. The source/drain contact 170 may be surrounded by the first interlayer insulating layer 191. The source/drain contact 170 passes through the source/drain etch stop layer 156. The source/drain contact 170 is shown as being in contact with the source/drain etch stop layer 156, but the example embodiments are not limited thereto.

A first silicide layer 155 may be formed between the source/drain contact 170 and the first source/drain pattern 150. A second silicide layer 255 may be formed between the source/drain contact 170 and the second source/drain pattern 250. The first silicide layer 155 is shown as being formed along a profile of a boundary between the first source/drain pattern 150 and the source/drain contact 170 and a profile of a boundary between the second source/drain pattern 250 and the source/drain contact 170, but the example embodiments are not limited thereto. The first silicide layer 155 and the second silicide layer 255 may include, for example, a metal silicide material.

The source/drain contact 170 may include a source/drain barrier layer 171 and a source/drain filling layer 172. The source/drain filling layer 172 may be disposed on the source/drain barrier layer 171. The source/drain barrier layer 171 may be extended along a bottom surface of the source/drain filling layer 172 and a sidewall 172_SW of the source/drain filling layer 172. The first source/drain pattern 150 and the second source/drain pattern 250 are connected with the source/drain barrier layer 171 and the source/drain filling layer 172, respectively.

The gate contact 175 may be disposed in the gate structure GS. The gate contact 175 may be connected with the first gate electrode 120 by passing through the gate capping pattern 145. For example, the gate contact 175 may be surrounded by the gate capping pattern 145.

The gate contact 175 may be disposed at a position that is overlapped with the gate structure GS. Although FIG. 1 shows that the gate contact 175 is disposed at a position that is not overlapped with the first active pattern AP1 and the second active pattern AP2, the gate contact 175 is not limited thereto. The gate contact 175 may be disposed at a position that is overlapped with at least one of the first active pattern AP1 or the second active pattern AP2.

The gate contact 175 may include a gate contact barrier layer 176 and a gate contact filling layer 177. The gate contact filling layer 177 may be disposed on the gate contact barrier layer 176. The gate contact barrier layer 176 may be extended along a bottom surface of the gate contact filling layer 177 and a sidewall 177_SW of the gate contact filling layer. The first gate electrode 120 is electrically connected with the gate contact barrier layer 176 and the gate contact filling layer 177.

A portion of the source/drain contact 170 may be protruded above the upper surface 145_US of the gate capping pattern. For example, based on a point that is most adjacent to the source/drain contact 170, a portion of the source/drain contact 170 may be protruded above the upper surface 145_US of the gate capping pattern. A portion of the source/drain contact 170 may be protruded above the upper surface of the first interlayer insulating layer 191. Based on the point that is most adjacent to the source/drain contact 170, a portion of the source/drain contact 170 may be protruded above the upper surface of the first interlayer insulating layer 191. For example, in a portion of the source/drain contact 170, an upper surface 170_US of the source/drain contact may include a convex curved surface relative to the concave-curved surface of the gate capping pattern 145. For example, the upper surface 170_US of the source/drain contact may include a convex curved surface. The upper surface 170_US of the source/drain contact may be convex to be far away from the substrate 100. For example, an upper surface 172_US of the source/drain filling layer may include a convex curved surface.

For example, in FIG. 2a, based on the upper surface AP1_US of the first active pattern, the upper surface 170_US of the source/drain contact may be higher than the upper surface 145_US of the gate capping pattern. However, the example embodiments are not limited thereto. For example, in FIG. 4, based on the upper surface of the first lower pattern BP1, the upper surface 170_US of the source/drain contact may be higher than the upper surface of the first interlayer insulating layer 191.

A portion of the source/drain barrier layer 171 and a portion of the source/drain filling layer 172 may be protruded above the upper surface 145_US of the gate capping pattern, respectively. The source/drain barrier layer 171 and the source/drain filling layer 172 may be protruded above the upper surface of the first interlayer insulating layer 191.

In FIG. 5, the upper surface 170_US of the source/drain contact may include an upper surface 171_US of the source/drain barrier layer and the upper surface 172_US of the source/drain filling layer. A sidewall portion extended along the sidewall 172_SW of the source/drain filling layer of the source/drain barrier layer 171 includes the upper surface 171_US of the source/drain barrier layer.

In FIG. 2a, based on the upper surface AP1_US of the first active pattern, the upper surface 171_US of the source/drain barrier layer and the upper surface 172_US of the source/drain filling layer may be higher than the upper surface 145_US of the gate capping pattern. In FIG. 5, based on the upper surface of the first lower pattern BP1, the upper surface 171_US of the source/drain barrier layer and the upper surface 172_US of the source/drain filling layer may be higher than the upper surface of the first interlayer insulating layer 191.

A portion of the source/drain filling layer 172 may be protruded above the upper surface 171_US of the source/drain barrier layer. A portion of the source/drain filling layer 172 is positioned to be higher than the upper surface 171_US of the source/drain barrier layer. Based on the upper surface AP1_US of the first active pattern or the upper surface of the first lower pattern BP1, the upper surface 172_US of the source/drain filling layer may be higher than the upper surface 171_US of the source/drain barrier layer.

In FIG. 5, the source/drain barrier layer 171 is shown as entirely covering the sidewall 172_SW of the source/drain filling layer, but the example embodiments not limited thereto. The source/drain barrier layer 171 may not cover a portion of the sidewall 172_SW of the source/drain filling layer.

A portion of the gate contact 175 may be protruded above the upper surface 145_US of the gate capping pattern. For example, based on a point that is most adjacent to the gate contact 175, a portion of the gate contact 175 may be protruded above the upper surface 145_US of the gate capping pattern.

In FIGS. 2a and 3, based on the upper surface AP1_US of the first active pattern, the upper surface 175_US of the gate contact may be higher than the upper surface 145_US of the gate capping pattern.

Each of a portion of the gate contact barrier layer 176 and a portion of the gate contact filling layer 177 may be protruded above the upper surface 145_US of the gate capping pattern.

The upper surface 175_US of the gate contact may include an upper surface 176_US of the gate contact barrier layer and an upper surface 177_US of the gate contact filling layer. A sidewall portion extended along the sidewall 177_SW of the gate contact filling layer of the gate contact barrier layer 176 includes the upper surface 176_US of the gate contact barrier layer. Based on the upper surface AP1_US of the first active pattern, the upper surface 176_US of the gate contact barrier layer and the upper surface 177_US of the gate contact filling layer may be higher than the upper surface 145_US of the gate capping pattern.

A portion of the gate contact filling layer 177 may be protruded above the upper surface 176_US of the gate contact barrier layer. A portion of the gate contact filling layer 177 is positioned to be higher than the upper surface 176_US of the gate contact barrier layer. Based on the upper surface AP1_US of the first active pattern, the upper surface 177_US of the gate contact filling layer may be higher than the upper surface 176_US of the gate contact barrier layer.

In FIG. 6, the gate contact barrier layer 176 is shown as entirely covering the sidewall 177_SW of the gate contact filling layer, but the example embodiments are not limited thereto. The gate contact barrier layer 176 may not cover a portion of the sidewall 177_SW of the gate contact filling layer.

The upper surface 175_US of the gate contact may include a convex curved surface. The upper surface 175_US of the gate contact may be convex to be far away from the substrate 100. For example, the upper surface 177_US of the gate contact filling layer may include a convex curved surface.

Each of the source/drain barrier layer 171 and/or the gate contact barrier layer 176 may include a conductive material. The conductive material may be (and/or include) at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional (2D) material. In the semiconductor device according to some embodiments, the two-dimensional material may be a metallic material and/or a semiconductor material. The two-dimensional (2D) material may include a two-dimensional allotrope and/or a two-dimensional compound, and may include, but is not limited to, at least one of, for example, graphene, molybdenum disulfide (MoS$_2$), molybdenum diselenide (MoSe$_2$), tungsten diselenide (WSe$_2$), or tungsten disulfide (WS$_2$). Since the two-dimensional material is only listed by way of example, the two-dimensional material that may be included in the semiconductor device of the present disclosure is not limited by the aforementioned example materials.

Each of the source/drain filling layer 172 and/or the gate contact filling layer 177 may include a conductive material. The conductive material may be (and/or include) at least one of, for example, aluminum (Al), tungsten (W), cobalt (Co), copper (Cu), ruthenium (Ru), silver (Ag), gold (Au), manganese (Mn), molybdenum (Mo), their combination, and/or the like.

A second interlayer insulating layer 192 may be disposed on the first interlayer insulating layer 191 and the gate structure GS. The second interlayer insulating layer 192 may include an insulating material. The insulating material may be (and/or include) at least one of, for example, silicon oxide, silicon nitride, silicon carbonitride, silicon oxynitride, a low dielectric constant material, their combination, and/or the like.

A lower etch stop layer 195 may be disposed between the first interlayer insulating layer 191 and the second interlayer insulating layer 192. The lower etch stop layer 195 may be extended along the upper surface 145_US of the gate capping pattern, the upper surface of the first interlayer insulating layer 191, the upper surface 170_US of the source/drain contact, and the upper surface 175_US of the gate contact.

The lower etch stop layer 195 may include a material having an etch selectivity with respect to the second interlayer insulating layer 192. The lower etch stop layer 195 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), their combination, and/or the like. The lower etch stop layer 195 is shown as a single layer, but the example embodiments are not limited thereto. In some example embodiments, unlike the shown example, the lower etch stop layer 195 may not be formed.

A wiring structure is disposed on the source/drain contact 170 and the gate contact 175. The wiring structure may include a source/drain via plug 180, a gate via plug, 185, and a wiring line 205.

The source/drain via plug 180 and the gate via plug 185 may be disposed in the second interlayer insulating layer 192. The source/drain via plug 180 may directly be connected with the source/drain contact 170 by passing through the lower etch stop layer 195. The gate via plug 185 may directly be connected with the gate contact 175 by passing through the lower etch stop layer 195.

A boundary where the source/drain via plug 180 and the source/drain contact 170 meet each other may include a curved surface that is upwardly convex, like the upper surface 170_US of the source/drain contact. A boundary where the gate via plug 185 and the gate contact 175 meet each other may include a curved surface that is upwardly convex, like the upper surface 170_US of the source/drain contact.

As the upper surface 170_US of the source/drain contact has a convex curved surface, a contact surface between the source/drain contact 170 and the source/drain via 180 may be increased. Also, as the upper surface 175_US of the gate contact has a convex curved surface, a contact surface between the gate contact 175 and the gate via plug 185 may be increased. Therefore, a resistance between the source/drain contact 170 and the source/drain via plug 180 and a resistance between the gate contact 175 and the gate via plug 185 may be reduced, and the performance and reliability of the semiconductor device according to the example embodiments of the present disclosure may be improved.

The source/drain via plug 180 may include a first via barrier layer 180a and a first via filling layer 180b. The gate via plug 185 may include a second via barrier layer 185a and a second via filling layer 185b. The first via barrier layer 180a may be extended along a sidewall and a bottom surface of the first via filling layer 180b. The second via barrier layer 185a may be extended along a sidewall and a bottom surface of the second via filling layer 185b.

Each of the first via barrier layer 180a and the second via barrier layer 185a may include a conductive material. The conductive material may be (and/or include) at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), a two-dimensional (2D) material, their combination, and/or the like.

Each of the first via filling layer 180b and the second via filling layer 185b may include a conductive material. The conductive material may be (and/or include) at least one of, for example, aluminum (Al), tungsten (W), cobalt (Co), ruthenium (Ru), copper (Cu), silver (Ag), gold (Au), manganese (Mn), molybdenum (Mo), their combination, and/or the like.

In FIG. 5, a width of the source/drain contact 170 in the first direction D1 is the same as that of the source/drain via plug 180 in the first direction D1 at a point where the source/drain via plug 180 and the source/drain contact 170 meet each other, but the example embodiments are not limited thereto.

In FIG. 6, a width of the gate contact 175 in the second direction D2 is the same as that of the gate via plug 185 in the second direction D2 at a point where the gate via pug 185 and the gate contact 175 meet each other, but the example embodiments are not limited thereto.

An upper etch stop layer 196 may be disposed between the second interlayer insulating layer 192 and a third interlayer insulating layer 193. The upper etch stop layer 196 may be extended along the upper surface of the second interlayer insulating layer 192.

The upper etch stop layer 196 may include a material having an etch selectivity with respect to the third interlayer insulating layer 193. The upper etch stop layer 196 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), their combination, and/or the like. The upper etch stop layer 196 is shown as a single layer, but the example embodiments are not limited thereto. In some example embodiments, unlike the shown example, the upper etch stop layer 196 may not be formed.

The wiring line 205 may be disposed in the third interlayer insulating layer 193. The wiring line 205 is connected with the source/drain via plug 180. The wiring line 205 is in contact with the source/drain via plug 180. The wiring line 205 is connected with the gate via plug 185. The wiring line 205 is in contact with the gate via plug 185.

The wiring line 205 may include a wiring barrier layer 205a and a wiring filling layer 205b.

The wiring barrier layer 205a may include a conductive material. The conductive material may be (and/or include) at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. The wiring filling layer 205b may include at least one of, for example, aluminum (Al), copper (Cu), tungsten (W), cobalt (Co), ruthenium (Ru), silver (Ag), gold (Au), manganese (Mn), molybdenum (Mo), their combination, and/or the like.

In some example embodiments, unlike the shown example, the first via barrier layer 180a may not be disposed between the first via filling layer 180b and the wiring filling layer 205b and/or the second via barrier layer 185a may not be disposed between the second via filling layer 185b and the wiring filling layer 205b.

Although not shown, a first connection contact connecting the source/drain via plug 180 with the source/drain contact 170 may further be disposed between the source/drain via plug 180 and the source/drain contact 170. Also, a second connection contact connecting the gate via plug 185 with the gate contact 175 may further be disposed between the gate via plug 185 and the gate contact 175.

Figure 7:
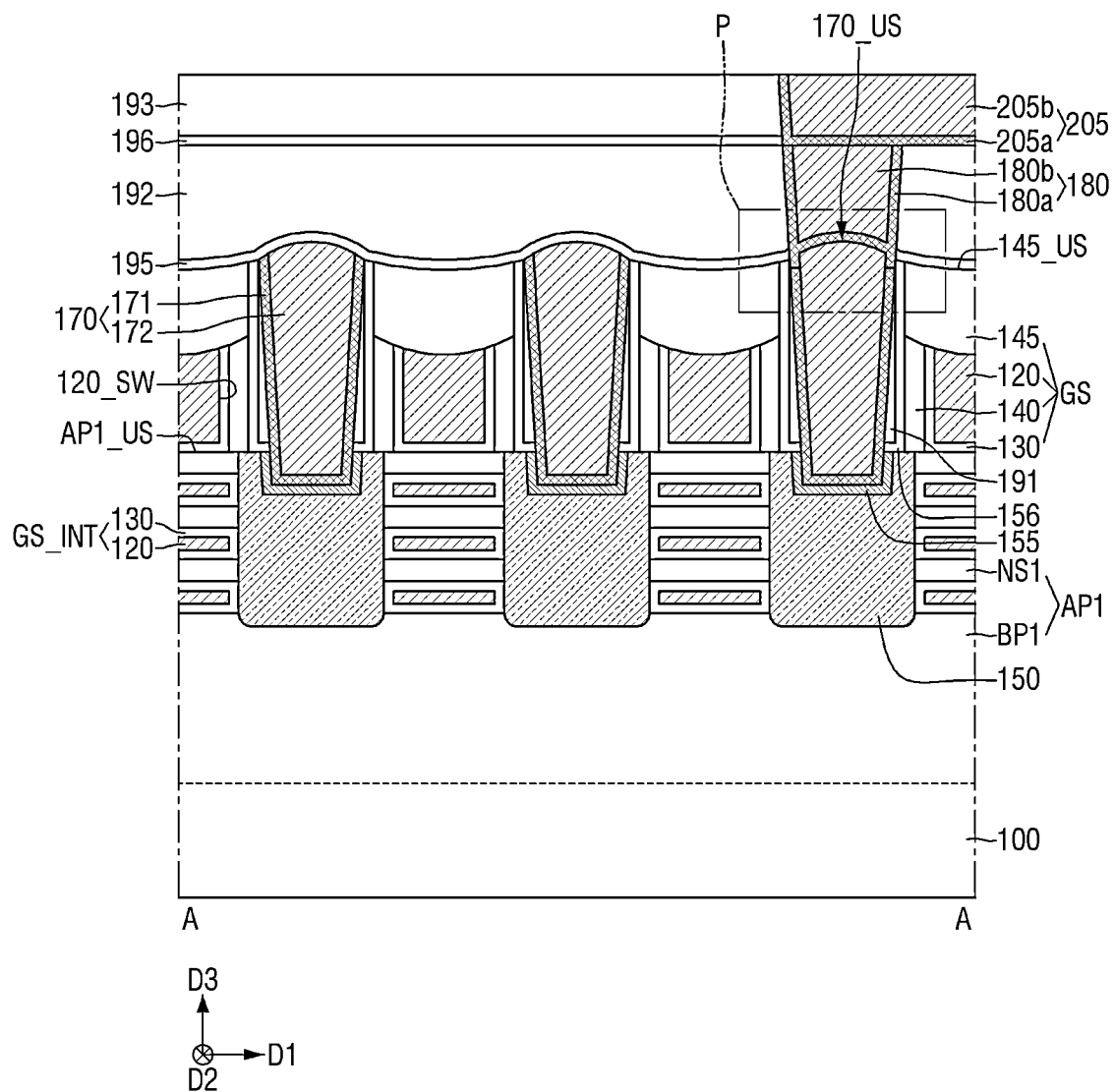
FIGS. 7 and 8 are views illustrating a semiconductor device according to some embodiments.
Figure 8:
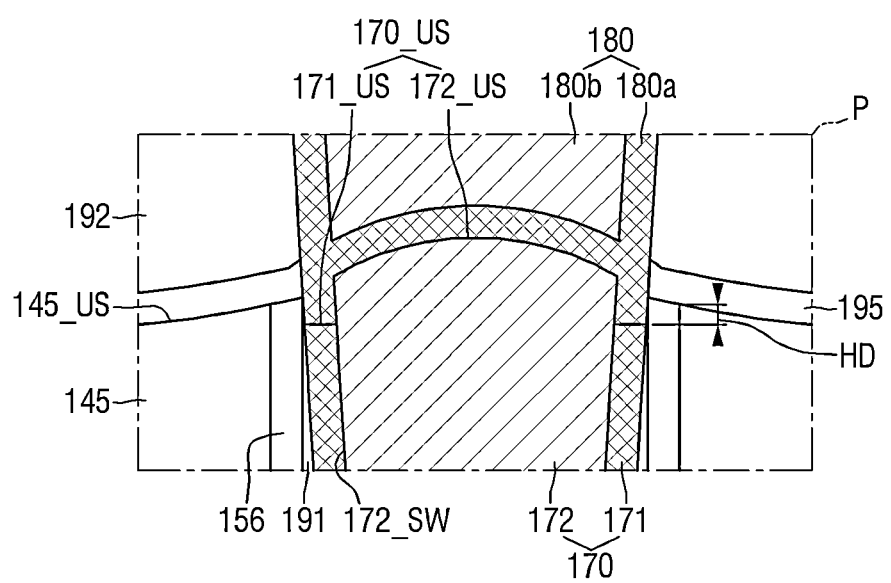
Figure 9:
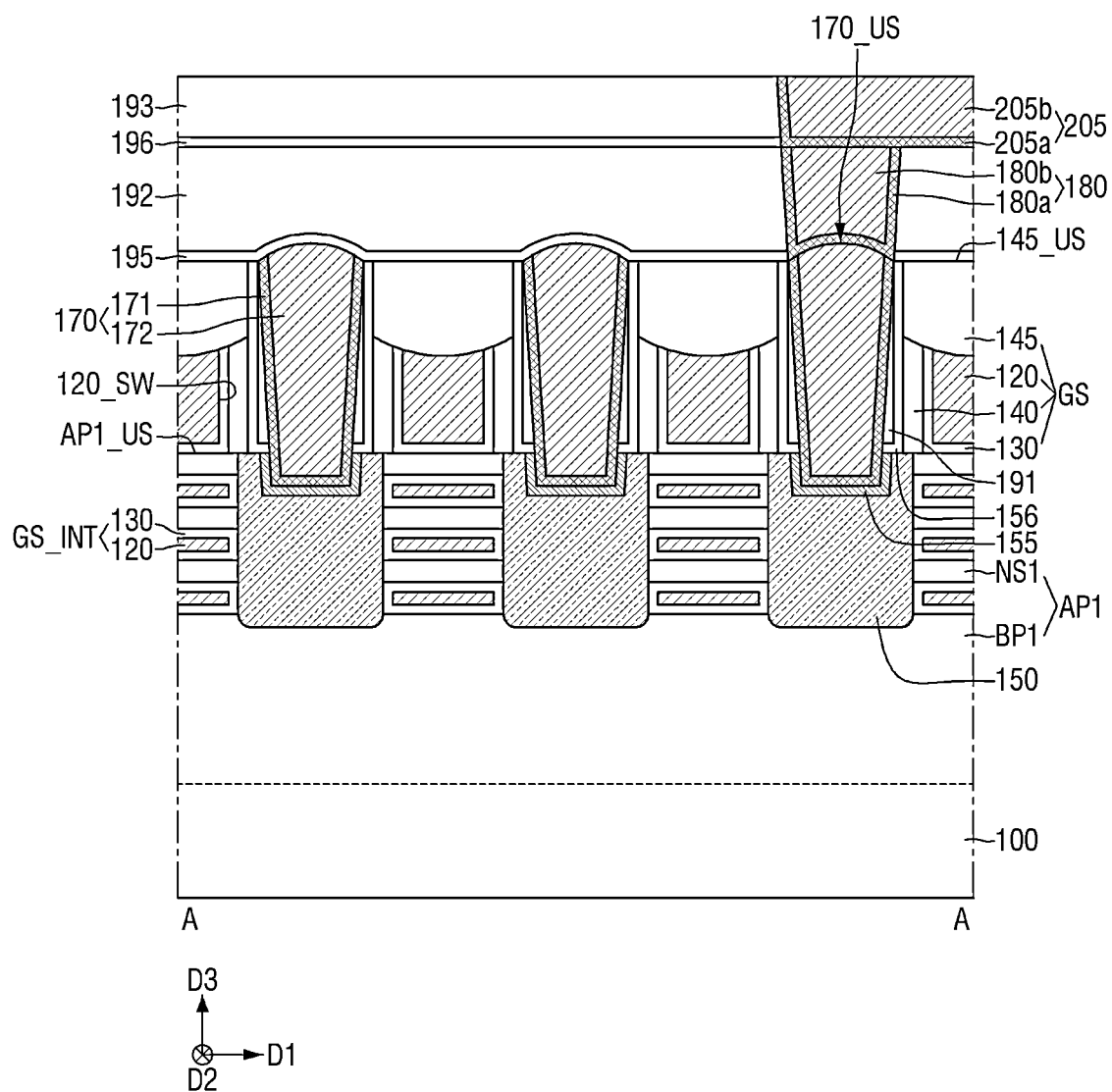
FIGS. 9 to 11 are views illustrating a semiconductor device according to some embodiments.
Figure 10:
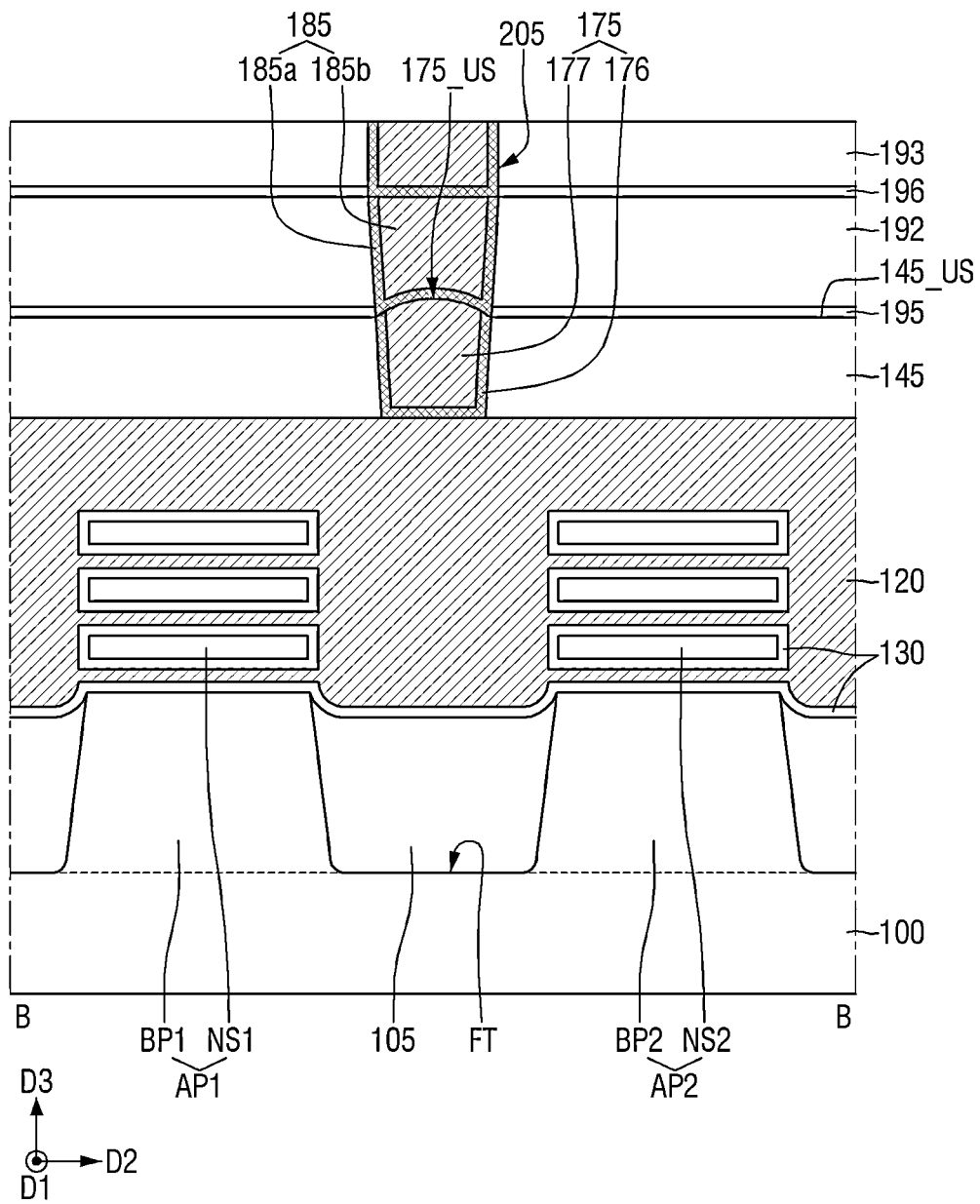
Figure 11:
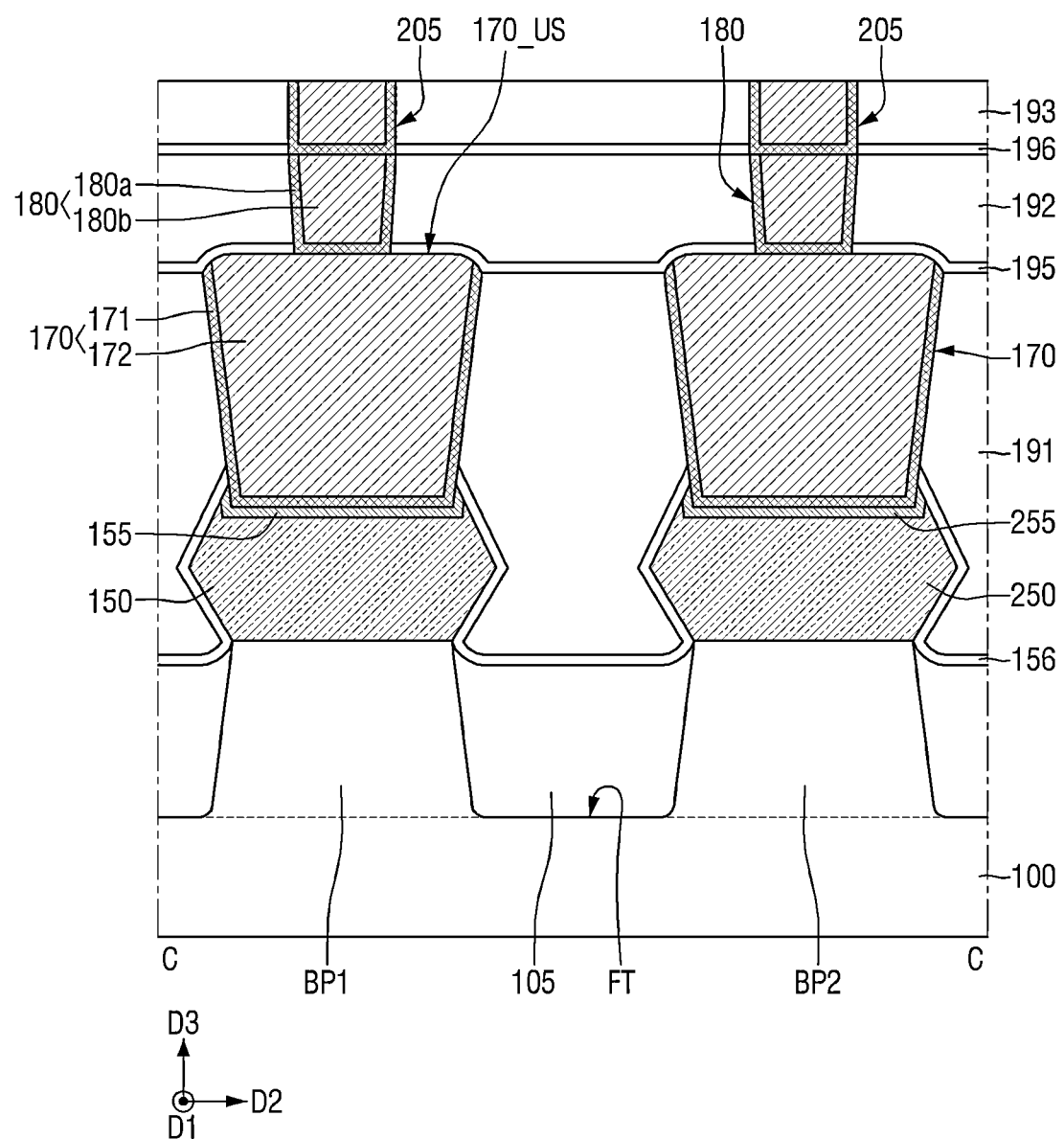
Figure 12:
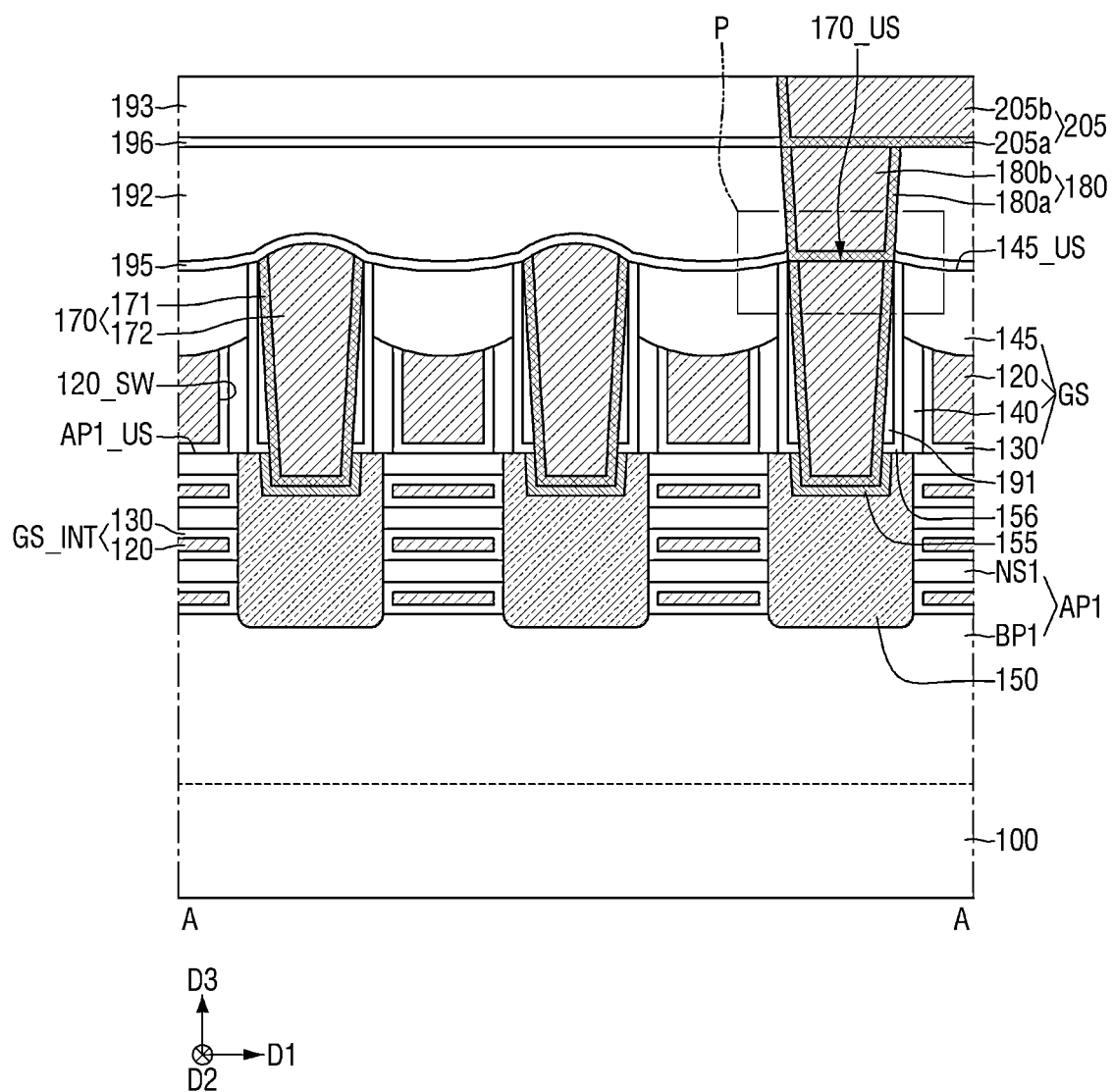
FIGS. 12 to 14 are views illustrating a semiconductor device according to some embodiments.
Figure 13:
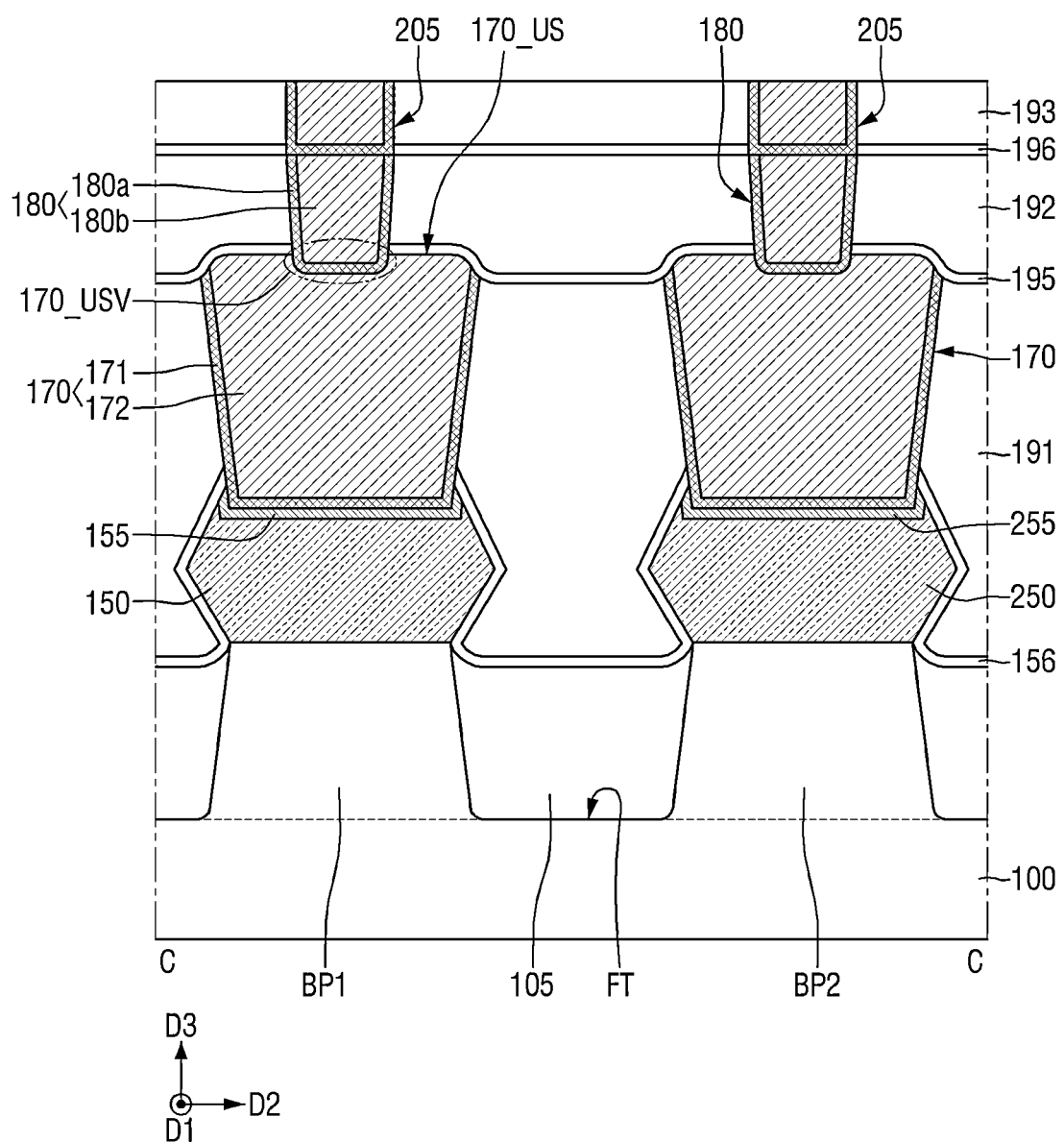
Figure 14:
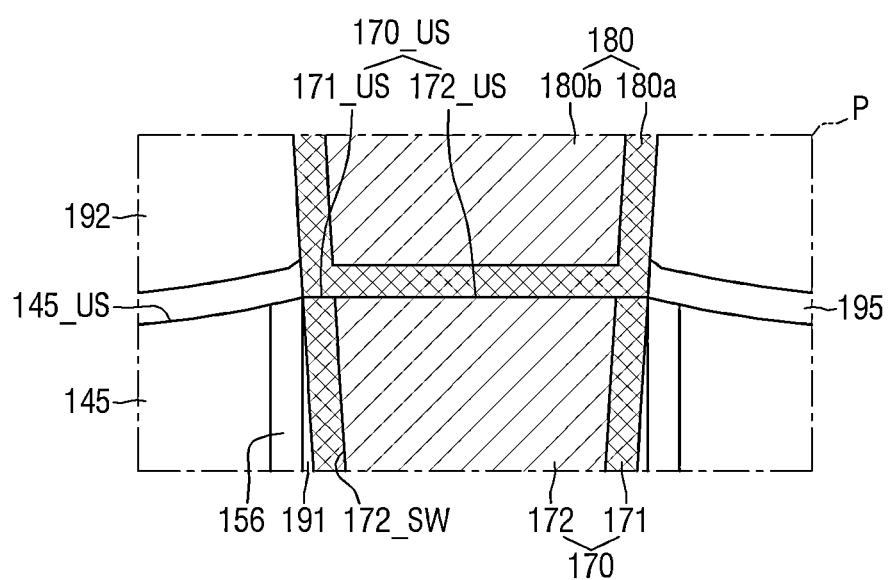
Figure 15:
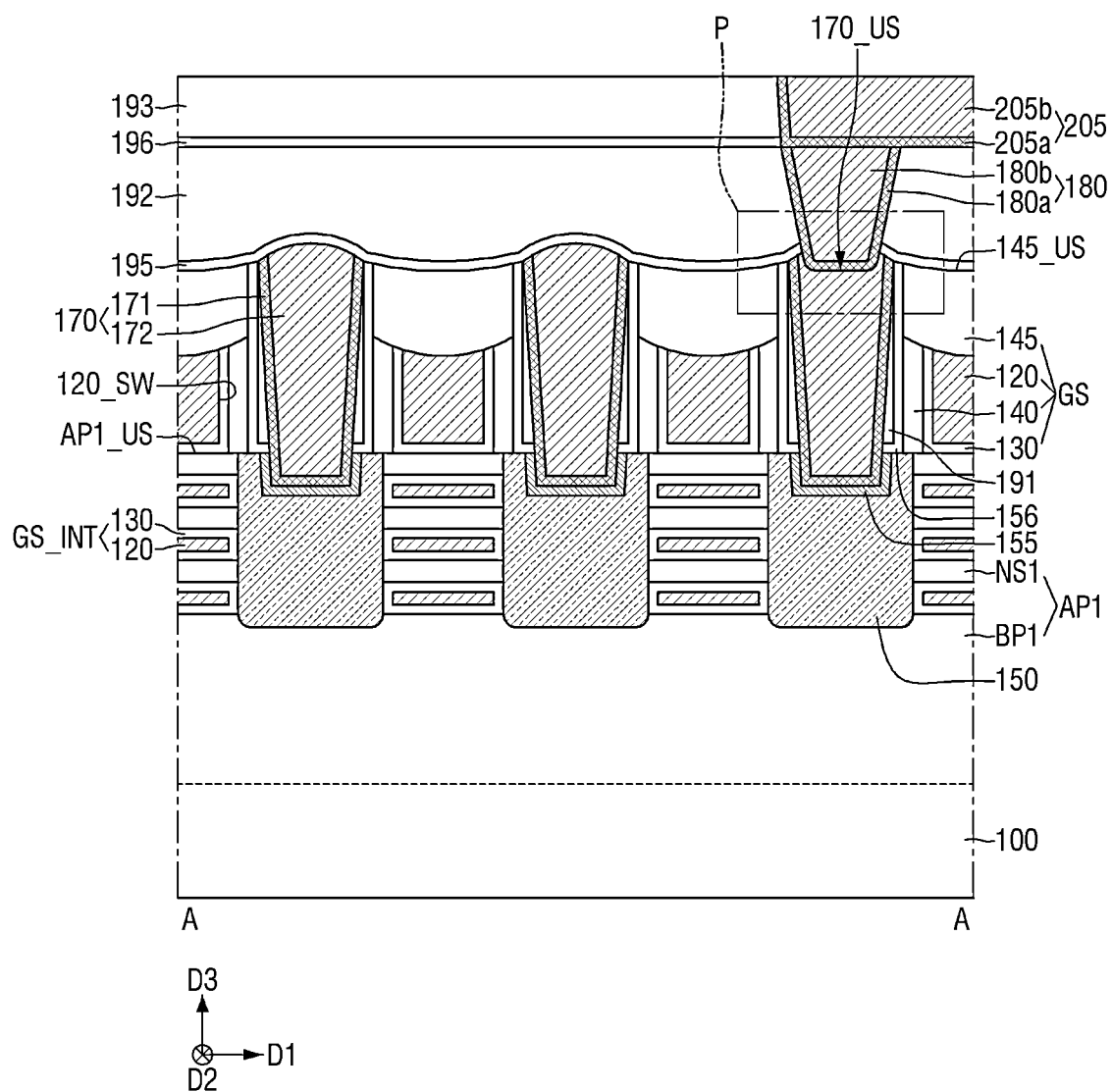
FIGS. 15 to 17 are views illustrating a semiconductor device according to some embodiments.
Figure 16:
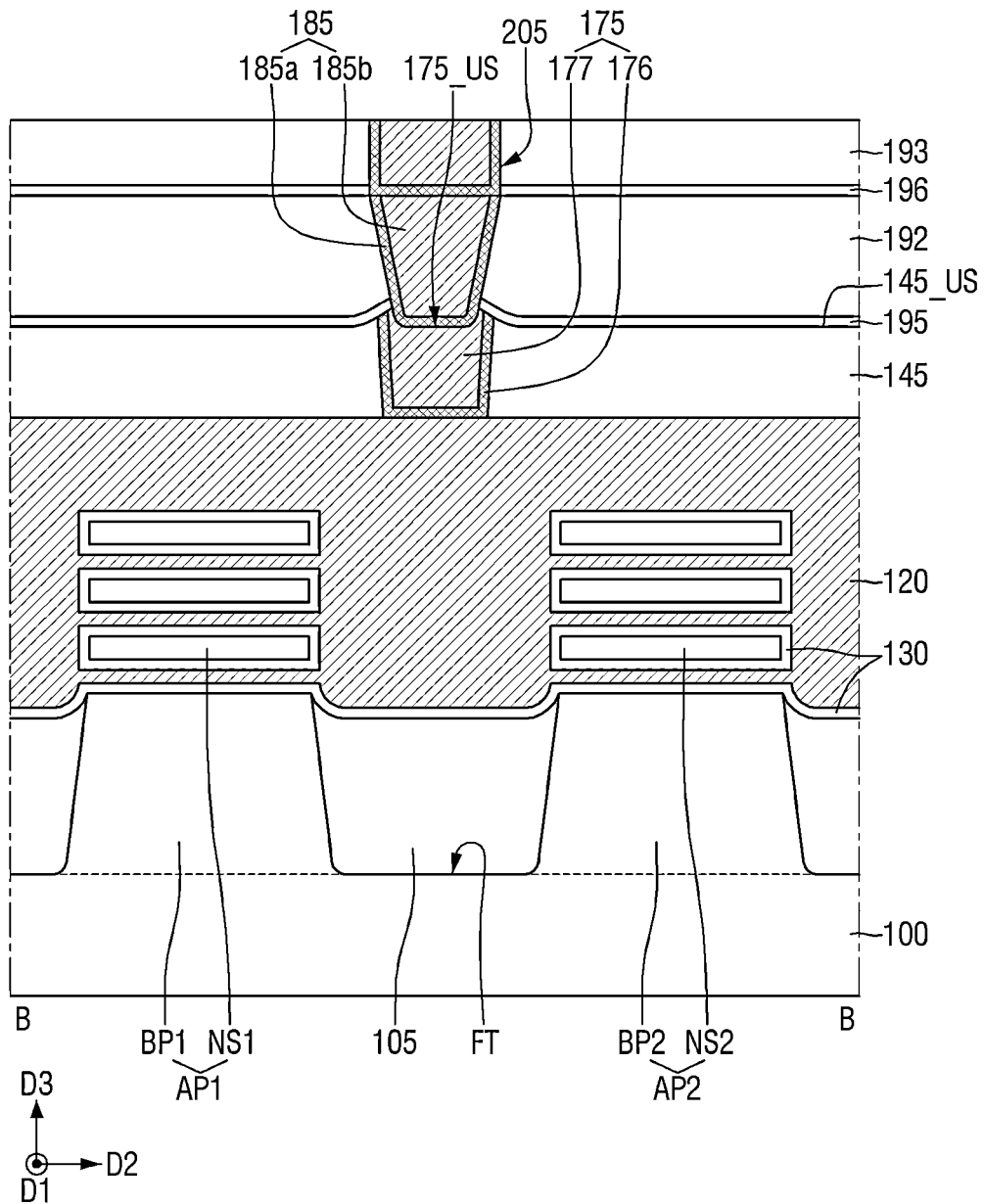
Figure 17:
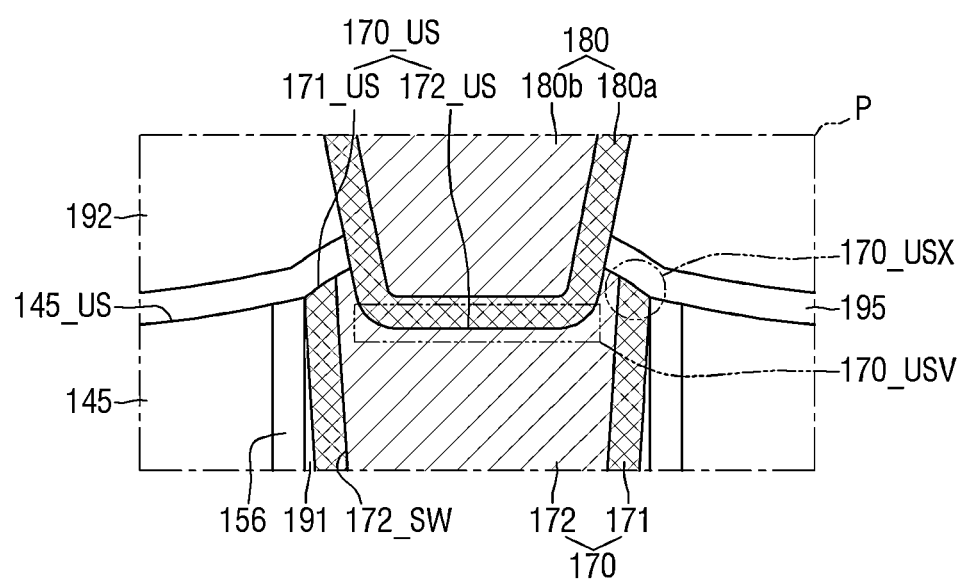
Figure 18:
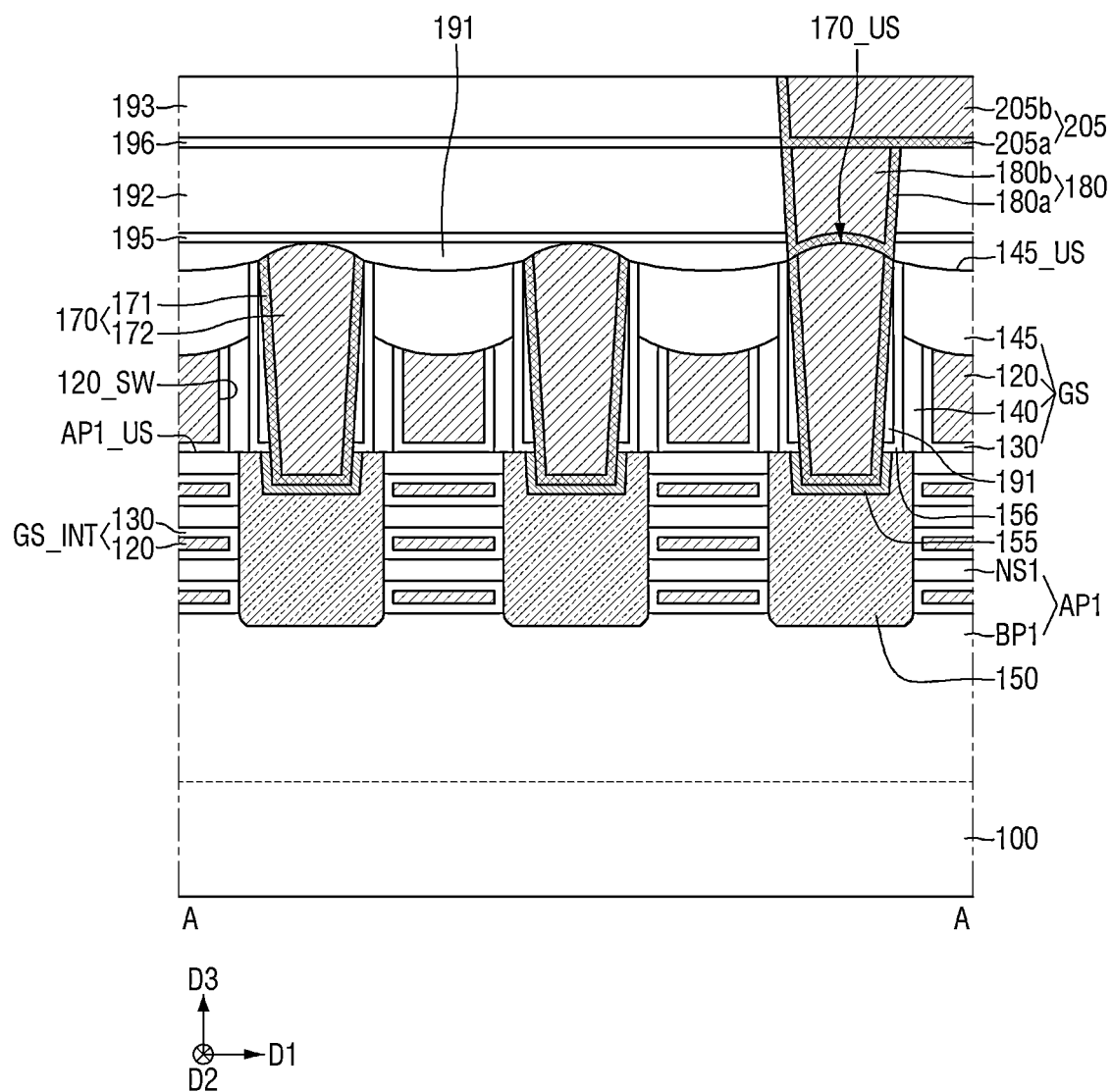
FIGS. 18 and 19 are views illustrating a semiconductor device according to some embodiments.
Figure 19:
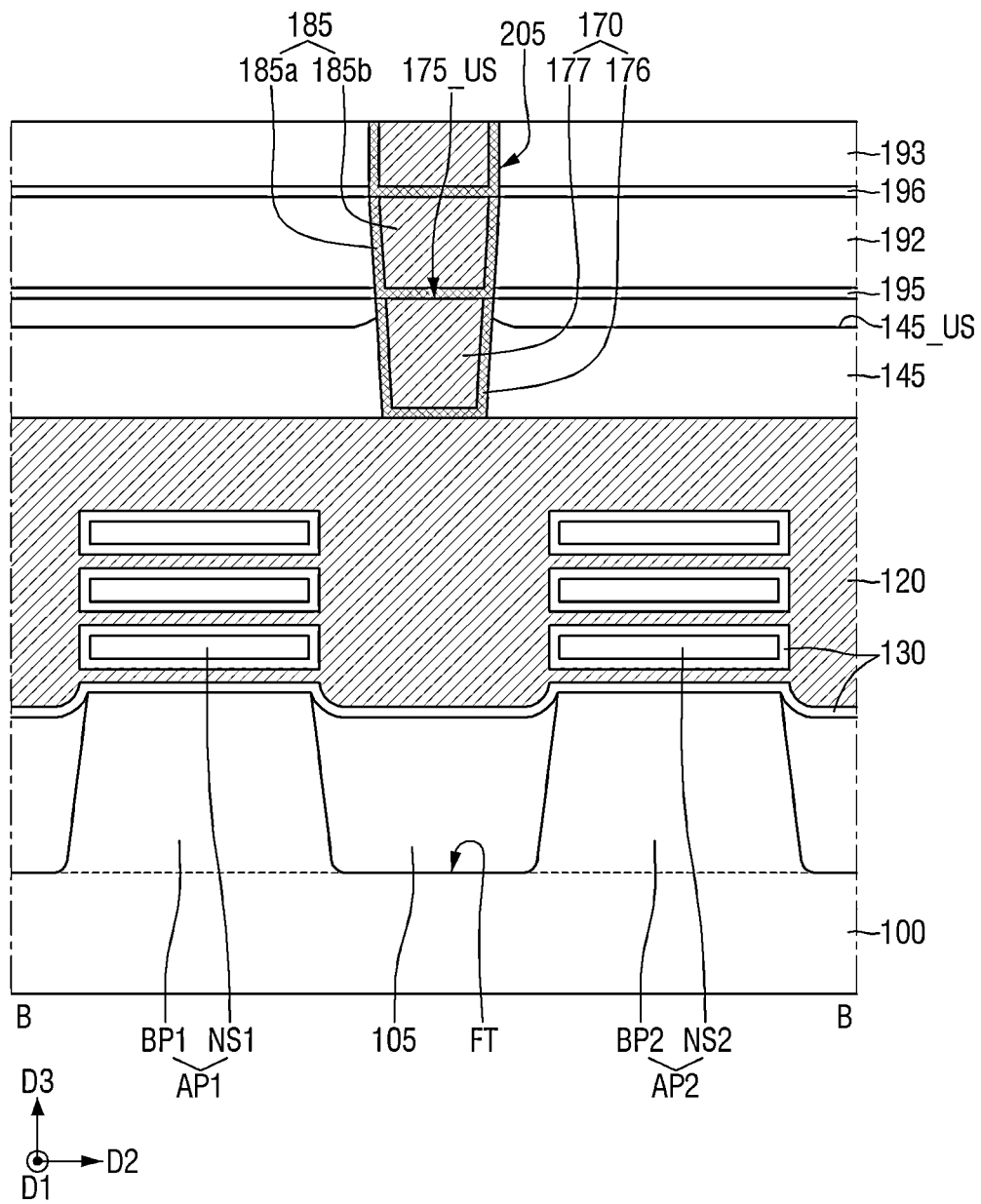

FIGS. 7 and 8 are views illustrating a semiconductor device according to some embodiments. FIGS. 9 to 11 are views illustrating a semiconductor device according to some embodiments. FIGS. 12 to 14 are views illustrating a semiconductor device according to some embodiments. FIGS. 15 to 17 are views illustrating a semiconductor device according to some embodiments. FIGS. 18 and 19 are views illustrating a semiconductor device according to some embodiments. For convenience of description, the following description will be based on a difference from FIGS. 1 to 6.

For reference, FIG. 8, FIGS. 14 and 17 are enlarged views illustrating a portion P of FIGS. 7, 12 and 15. FIGS. 8, 14 and 17 are enlarged views illustrating a boundary portion of the source/drain contact 170 and the source/drain via plug 180. Although not shown, a boundary portion of the gate contact 175 and the gate via plug 185 may easily be inferred through FIGS. 8, 14 and 17.

Referring to FIGS. 7 and 8, in the semiconductor device according to some embodiments, the upper surface 171_US of the source/drain barrier layer 171 is lower than the upper surface 145_US of the gate capping pattern 145 based on the upper surface AP1_US of the first active pattern AP1. However, the upper surface 172_US of the source/drain filling layer 172 is higher than the upper surface 145_US of the gate capping pattern 145.

The upper surface 171_US of the source/drain barrier layer 171 may be lower than the upper surface 145_US of the gate capping pattern 145 as much as a first height HD. The source/drain barrier layer 171 may be disposed entirely below the upper surface 145_US of the gate capping pattern 145.

Although the source/drain via plug 180 is shown as in contact with the upper surface 171_US of the source/drain barrier layer, the source/drain via plug 180 is not limited thereto. Unlike the shown example, a portion of the lower etch stop layer 195 may be interposed between the bottom surface of the source/drain via plug 180 and the upper surface 171_US of the source/drain barrier layer. As another example, a portion of the source/drain filling layer 172 may move to cover the upper surface 171_US of the source/drain barrier layer.

Referring to FIGS. 9 to 11, in the semiconductor device according to some embodiments, the upper surface 145_US of the gate capping pattern 145 may be a flat plane.

A height of the upper surface 145_US of the gate capping pattern 145 based on the upper surface AP1_US of the first active pattern AP1 may be constant as the gate capping pattern 145 becomes far away from the source/drain contact 170 and the gate contact 175.

The upper surface of the first interlayer insulating layer 191 may be a flat plane. A height of the upper surface of the first interlayer insulating layer 191 based on the upper surface of the field insulating layer 105 may be constant as the first interlayer insulating layer 191 becomes far away from the source/drain contact 170.

In some example embodiments, unlike the shown example, one of the upper surface 145_US of the gate capping pattern and the upper surface of the first interlayer insulating layer 191 may be a flat plane. The other one of the upper surface 145_US of the gate capping pattern and the upper surface of the first interlayer insulating layer 191 may include a concave curved surface.

In FIGS. 12 to 14, in the semiconductor device according to some embodiments, a boundary between the source/drain via plug 180 and the source/drain contact 170 may be a flat plane at a point where the source/drain via plug 180 and the source/drain contact 170 meet each other.

In the cross-sectional view of the source/drain contact 170 taken along the first direction D1, the upper surface 170_US of the source/drain contact in which the source/drain via plug 180 is not landed may include a convex curved surface.

In the cross-sectional view of the source/drain contact 170 taken along the second direction D2, a portion of the source/drain via plug 180 may be recessed into the source/drain contact 170. At the boundary between the source/drain via plug 180 and the source/drain contact 170, the upper surface 170_US of the source/drain contact may include a concave curved portion 170_USX. For example, in FIG. 13, the upper surface 170_US of the source/drain contact may include a convex curved portion and a concave curved portion 170_USX.

Referring to FIGS. 15 to 17, in the semiconductor device according to some embodiments, the upper surface 170_US of the source/drain contact may include a convex curved portion 170_USX and a concave curved portion 170_USV.

On the upper surface 170_US of the source/drain contact, the convex curved portion 170_USX is a portion that does not form a boundary with the source/drain via plug 180, and the concave curved portion 170_USV may be a portion that forms a boundary with the source/drain via plug 180.

The upper surface 175_US of the gate contact may include a convex curved portion and a concave curved portion. On the upper surface 175_US of the gate contact, the concave curved portion may be a boundary portion between the gate contact 175 and the gate via plug 185.

At the point where the source/drain via plug 180 and the source/drain contact 170 meet each other, the width of the source/drain contact 170 in the first direction D1 may be greater than that of the source/drain via plug 180 in the first direction D1.

At the point where the gate via plug 185 and the gate contact 175 meet each other, the width of the gate contact 175 in the second direction D2 may be greater than that of the gate via plug 185 in the second direction D2.

Referring to FIGS. 18 and 19, in the semiconductor device according to some embodiments, the first interlayer insulating layer 191 may cover the upper surface 145_US of the gate capping pattern.

The first interlayer insulating layer 191 may cover the source/drain contact 170 more protruded than the upper surface 145_US of the gate capping pattern. The first interlayer insulating layer 191 may cover the upper surface 170_US of the source/drain contact having a convex curved surface.

The upper surface of the first interlayer insulating layer 191 may be a flat plane. The lower etch stop layer 195 may be formed along a profile of the upper surface of the first interlayer insulating layer 191.

The gate contact 175 is protruded above the upper surface 145_US of the gate capping pattern. The first interlayer insulating layer 191 may cover a sidewall of the gate contact 175 that is more protruded than the upper surface 145_US of the gate capping pattern.

In the semiconductor device according to some embodiments, the upper surface 175_US of the gate contact may be a flat plane. The first interlayer insulating layer 191 does not cover the upper surface 175_US of the gate contact.

In some example embodiments, unlike the shown example, the boundary portion between the gate contact 175 and the gate via plug 185 may include a concave curved portion as shown in FIG. 16.

Figure 20:
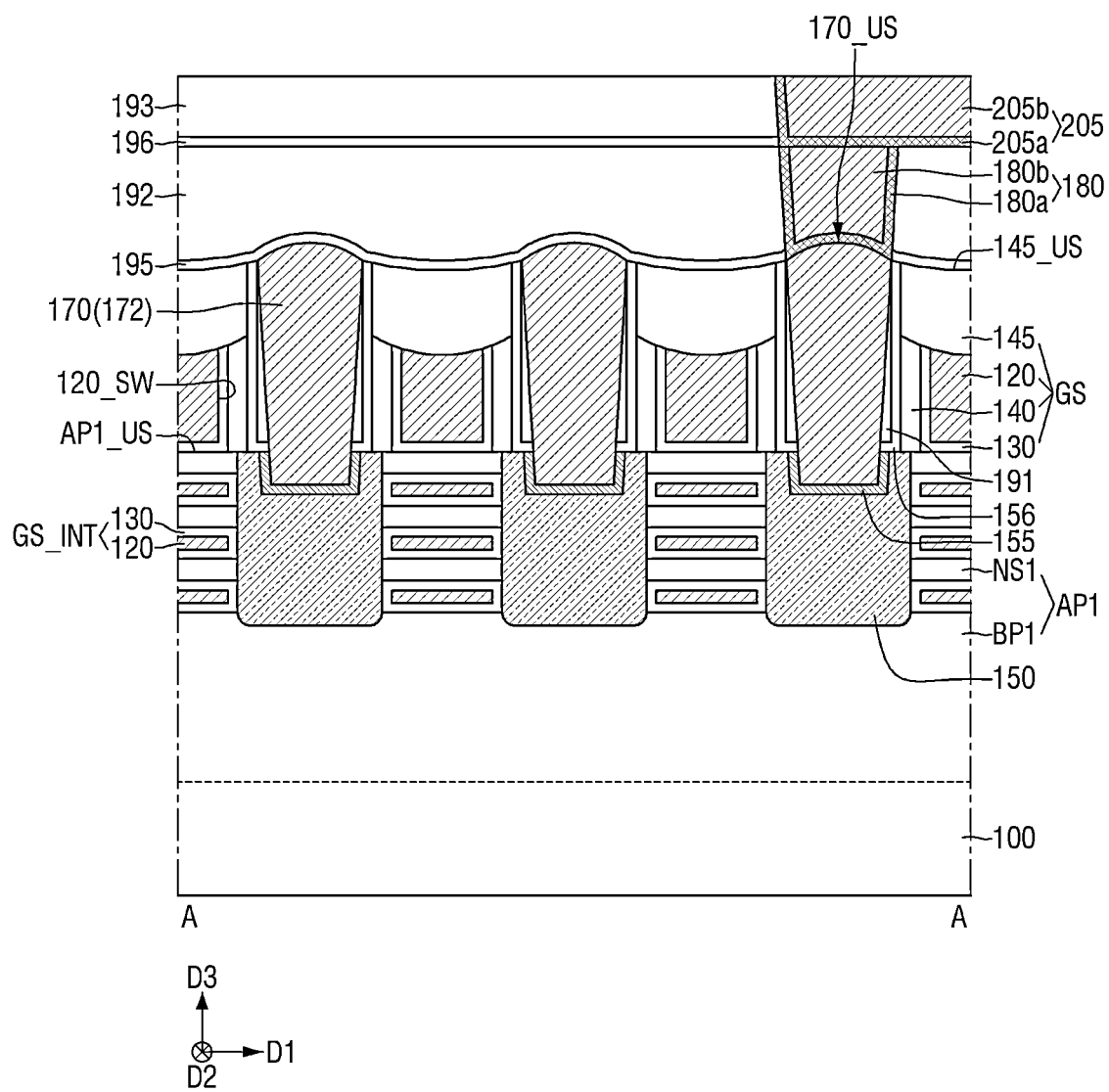
FIGS. 20 and 21 are views illustrating a semiconductor device according to some embodiments.
Figure 21:
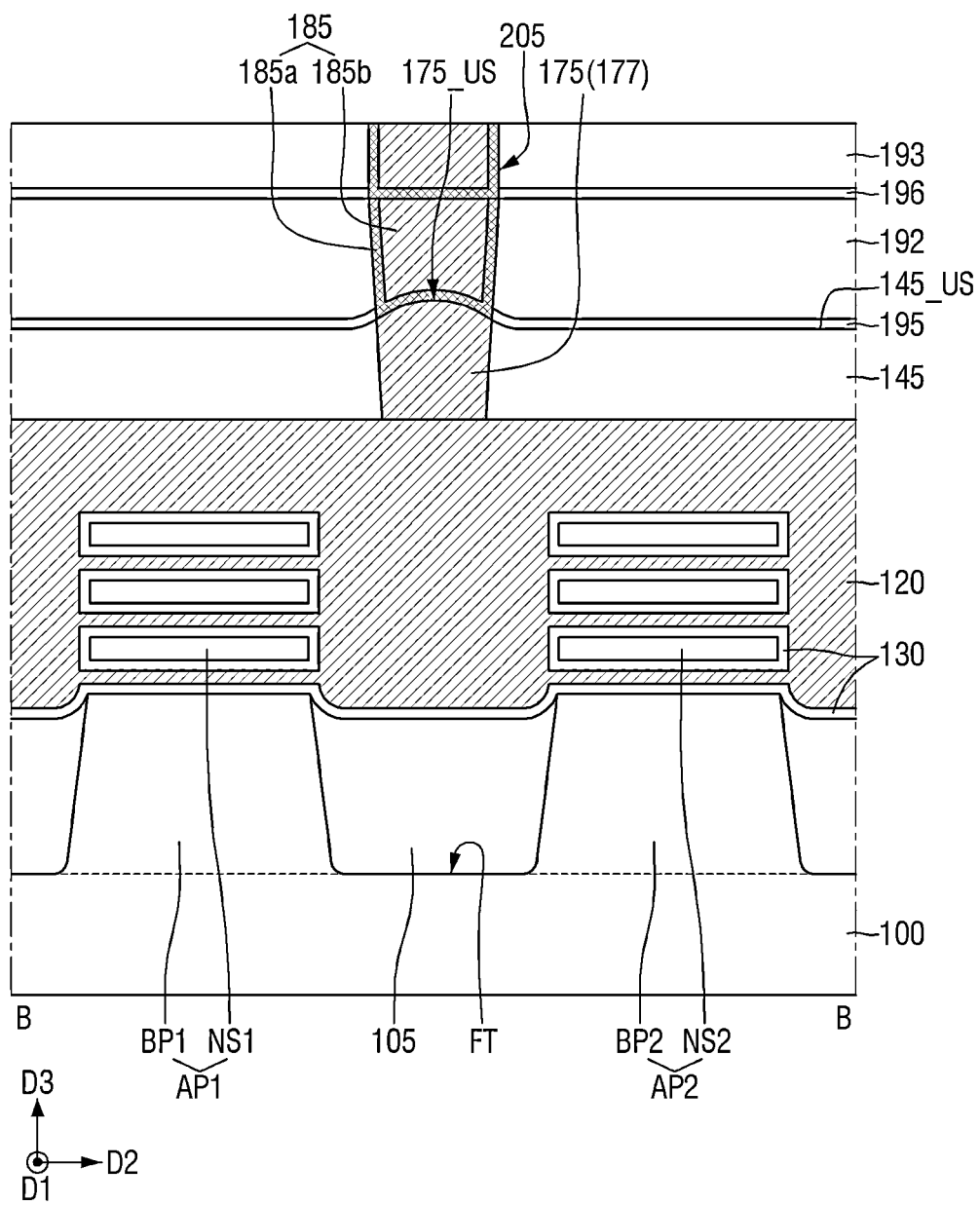
Figure 22:
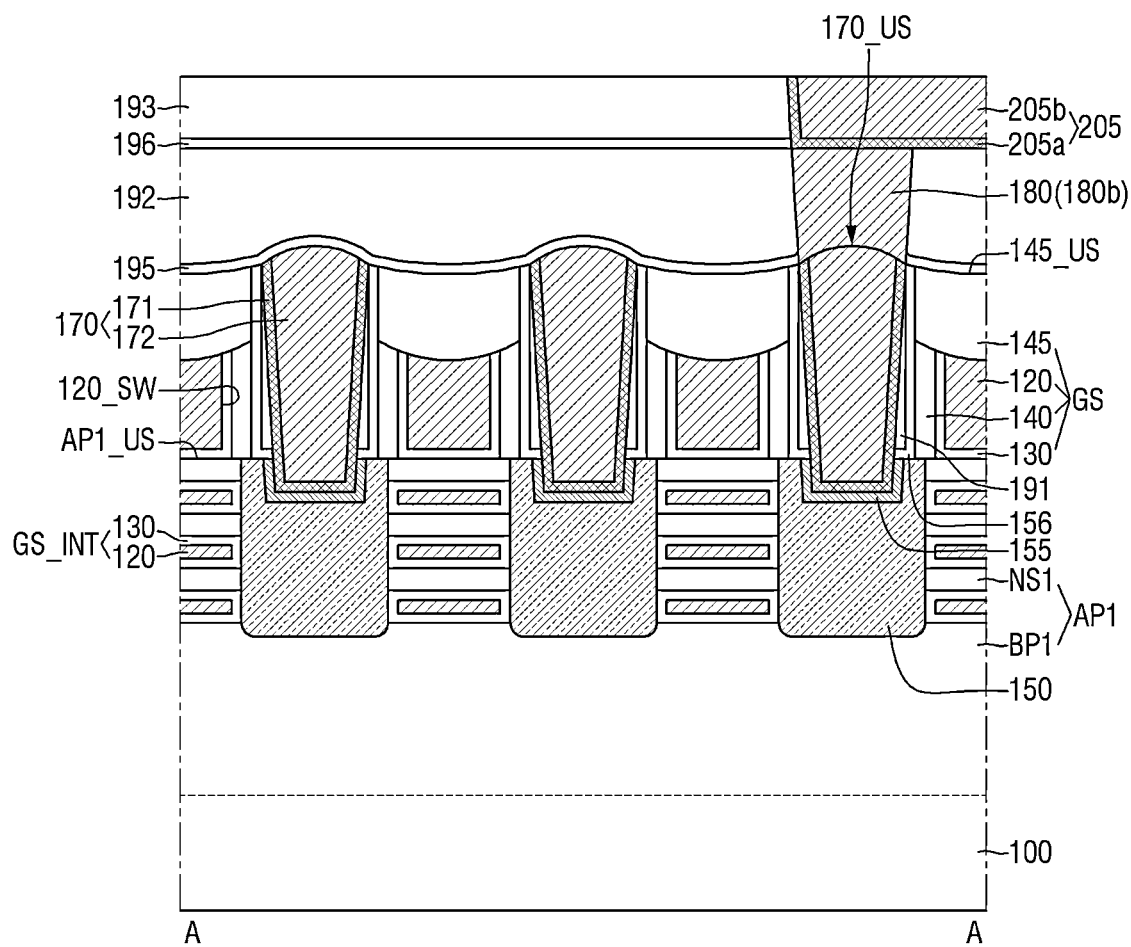
FIGS. 22 and 23 are views illustrating a semiconductor device according to some embodiments.
Figure 22:
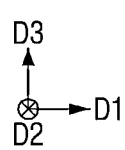
Figure 23:
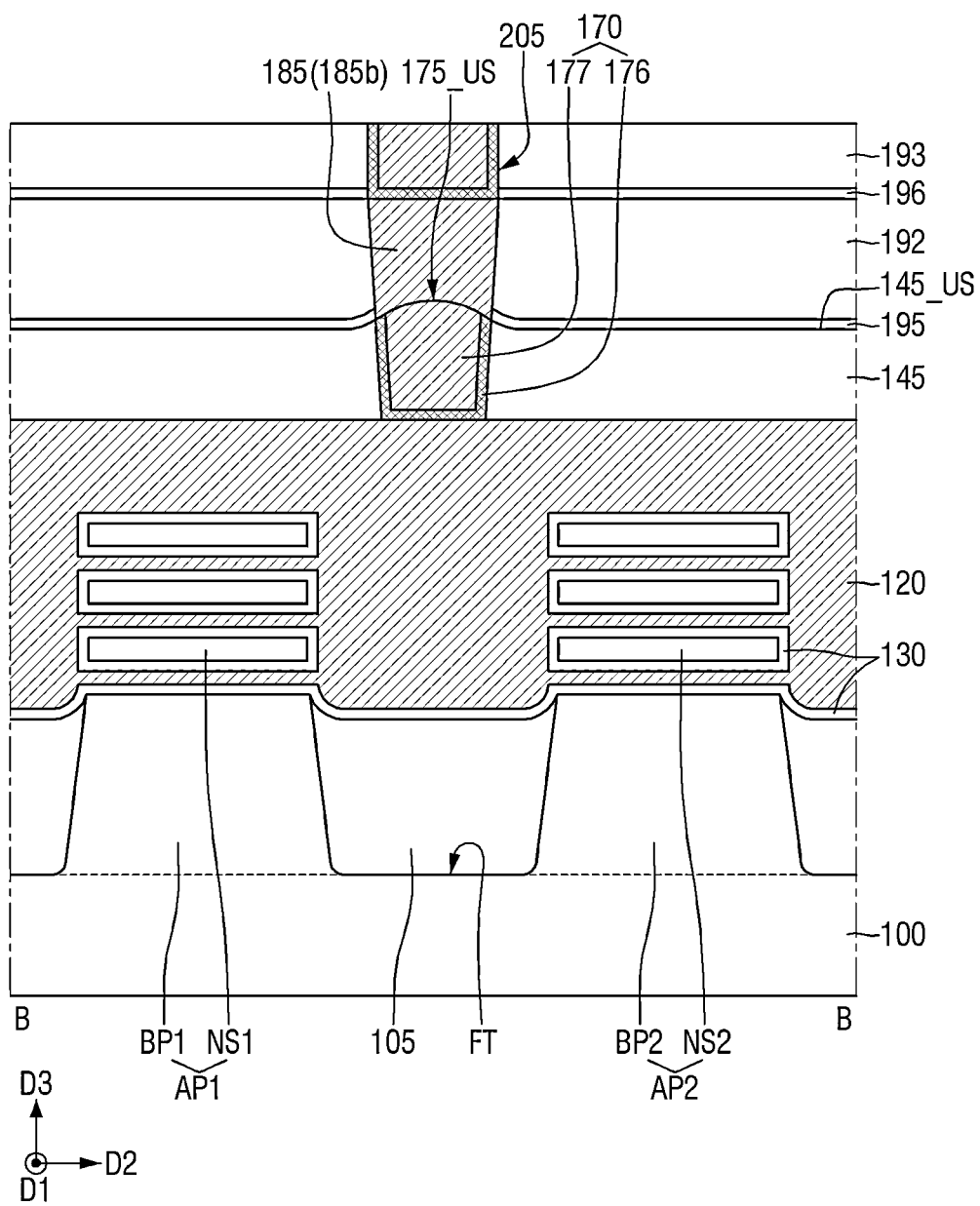
Figure 24:
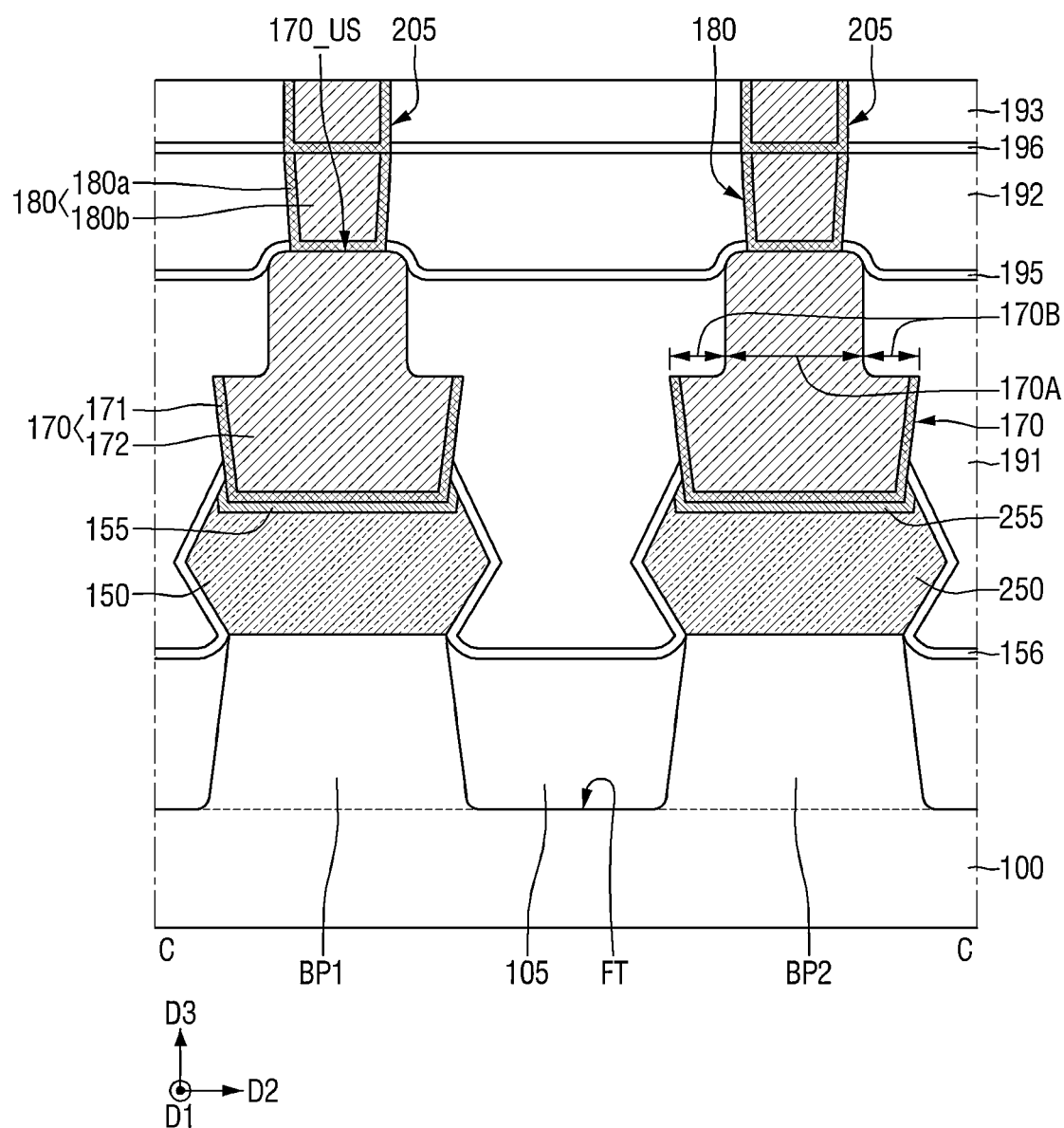
FIG. 24 is a view illustrating a semiconductor device according to some embodiments.
Figure 25:
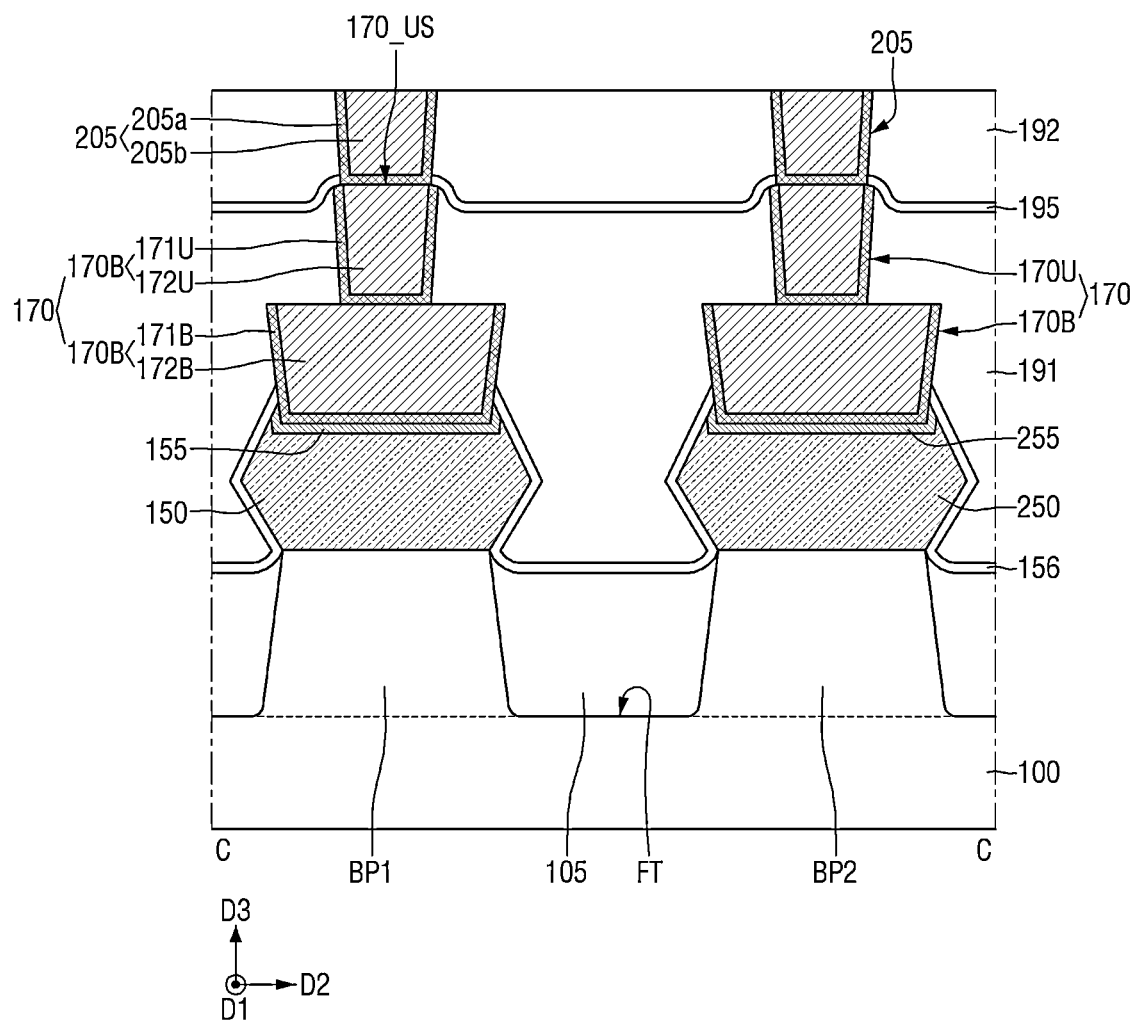
FIG. 25 is a view illustrating a semiconductor device according to some embodiments.

FIGS. 20 and 21 are views illustrating a semiconductor device according to some embodiments. FIGS. 22 and 23 are views illustrating a semiconductor device according to some embodiments. FIG. 24 is a view illustrating a semiconductor device according to some embodiments. FIG. 25 is a view illustrating a semiconductor device according to some embodiments. For convenience of description, the following description will be based on a difference from FIGS. 1 to 6. However, the example embodiments are not limited thereto, and may also be directed towards the embodiments included in FIGS. 7 to 19.

Referring to FIGS. 20 and 21, in the semiconductor device according to some embodiments, the source/drain contact 170 and the gate contact 175 do not include a barrier layer.

The source/drain contact 170 may include only the source/drain filling layer 172 without the source/drain barrier layer 171. The gate contact 175 may include only the gate contact filling layer 177 without the gate contact barrier layer 176.

Each of the source/drain contact 170 and the gate contact 175 may have a single layer structure. For example, the source/drain contact 170 and the gate contact 175 may be formed of a single layer. Each of the source/drain contact 170 and the gate contact 175 may have a single conductive layer structure. In some example embodiments, unlike this case, as shown in FIGS. 2a and 3, the source/drain contact 170 and the gate contact 175, each of which includes a barrier layer and a filling layer, may have a multi-conductive layer structure.

In some example embodiments, unlike the shown example, one of the source/drain contact 170 and the gate contact 175 may have a single conductive layer structure, and the other one thereof may have a multi-conductive layer structure.

Referring to FIGS. 22 and 23, in the semiconductor device according to some embodiments, the source/drain via plug 180 and the gate via plug 185 do not include a barrier layer.

The source/drain via plug 180 may include only the first via filling layer 180b without the first via barrier layer 180a. The gate via plug 185 may include only the second via filling layer 185b without the second via barrier layer 185a.

Each of the source/drain via plug 180 and the gate via plug 185 may have a single layer structure. Each of the source/drain via plug 180 and the gate via plug 185 may have a single conductive layer structure.

In some example embodiments, unlike the shown example, one of the source/drain via plug 180 and the gate via plug 185 may have a single conductive layer structure, and the other thereof one may have a multi-conductive layer structure.

Referring to FIG. 24, in the semiconductor device according to some embodiments, the source/drain contact 170 may include a first portion 170A and a second portion 170B. The first portion 170A of the source/drain contact may directly be connected with the second portion 170B of the source/drain contact.

The first portion 170A of the source/drain contact 170 is a portion in which the source/drain via plug 180 is landed (e.g., wherein the source/drain contact 170 and the source/drain via plug 180 contact). The source/drain contact 170 may be connected with the wiring line 205 through the first portion 170A of the source/drain contact. The second portion 170B of the source/drain contact 170 is not the portion in which the source/drain via plug 180 is landed.

An upper surface of the first portion 170A of the source/drain contact is higher than that of the second portion 170B of the source/drain contact 170. Based on the upper surface of the field insulating layer 105, the upper surface of the first portion 170A of the source/drain contact 170 is higher than that of the second portion 170B of the source/drain contact 170. For example, the upper surface 170_US of the source/drain contact 170 may be the upper surface of the first portion 170A of the source/drain contact 170.

A portion of the first portion 170A of the source/drain contact 170 may be protruded above the upper surface of the first interlayer insulating layer 191. Although not shown, a portion of the first portion 170A of the source/drain contact 170 may be protruded above the upper surface (145_US of FIG. 2a) of the gate capping pattern 145.

The upper surface of the first portion 170A of the source/drain contact 170 may include a convex curved surface.

The source/drain contact 170 may have a T-shape rotated by 180° but is not limited thereto. Alternatively, the source/drain contact 170 may have an L-shape.

Referring to FIG. 25, in the semiconductor device according to some embodiments, the source/drain contact 170 may include a lower source/drain contact 170B and an upper source/drain contact 170U.

The lower source/drain contact 170B may include a lower source/drain barrier layer 171B and a lower source/drain filling layer 172B. The upper source/drain contact 170U may include an upper source/drain barrier layer 171U and an upper source/drain filling layer 172U.

A portion of the upper source/drain contact 170U may be protruded above the upper surface of the first interlayer insulating layer 191. Although not shown, a portion of the upper source/drain contact 170U may be protruded above the upper surface (145_US of FIG. 2a) of the gate capping pattern.

The upper surface 170_US of the source/drain contact 170 may be an upper surface of the upper source/drain contact 170U. An upper surface 170_US of the upper source/drain contact 170 may include a convex curved surface.

Materials contained in the lower source/drain barrier layer 171B and the upper source/drain barrier layer 171U may be the same as those of the source/drain barrier layer 171 described above. Materials contained in the lower source/drain filling layer 172B and the upper source/drain filling layer 172U may be the same as those of the source/drain filling layer 172 described above.

For example, the upper source/drain contact 170U may be connected with the wiring line 205 without the source/drain via plug (180 of FIG. 2a). Although not shown, the gate contact (175 of FIG. 3) may be connected with the wiring line 205 without the gate via plug (185 of FIG. 3). In this case, the wiring line 205 may be disposed in the second interlayer insulating layer 192 and the lower etch stop layer 195.

In some example embodiments, unlike the shown example, the source/drain via plug (180 of FIG. 2a) may be disposed between the upper source/drain contact 170U and the wiring line 205. The gate via plug (185 of FIG. 3) may be disposed between the gate contact 175 and the wiring line 205.

Figure 26:
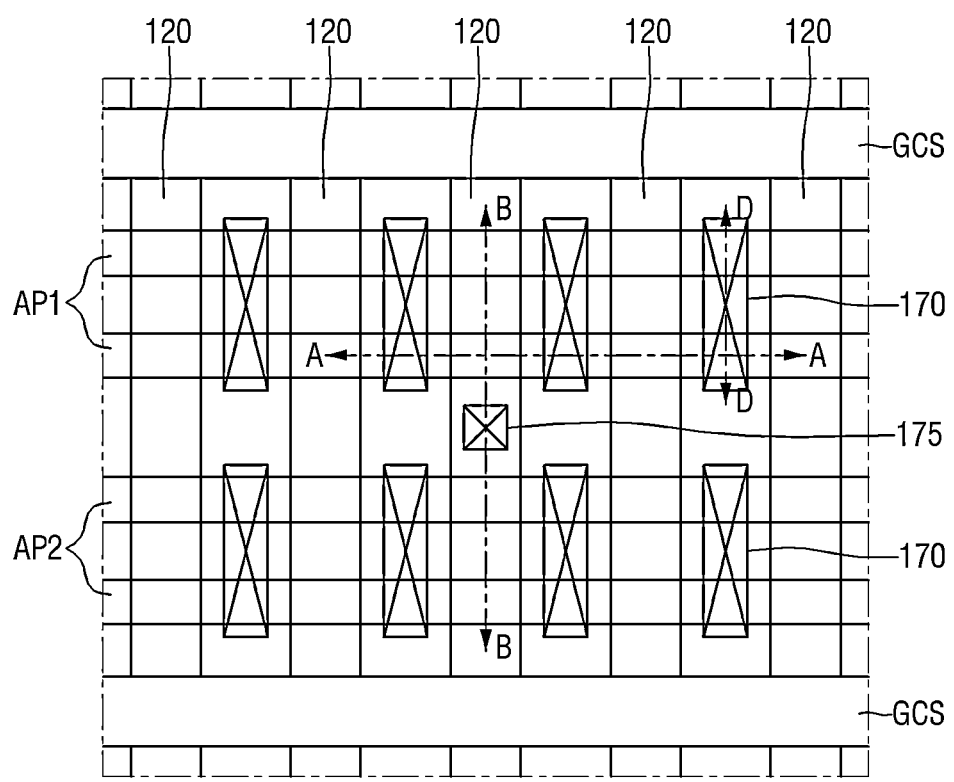
FIGS. 26 to 29 are views illustrating a semiconductor device according to some embodiments.
Figure 27:
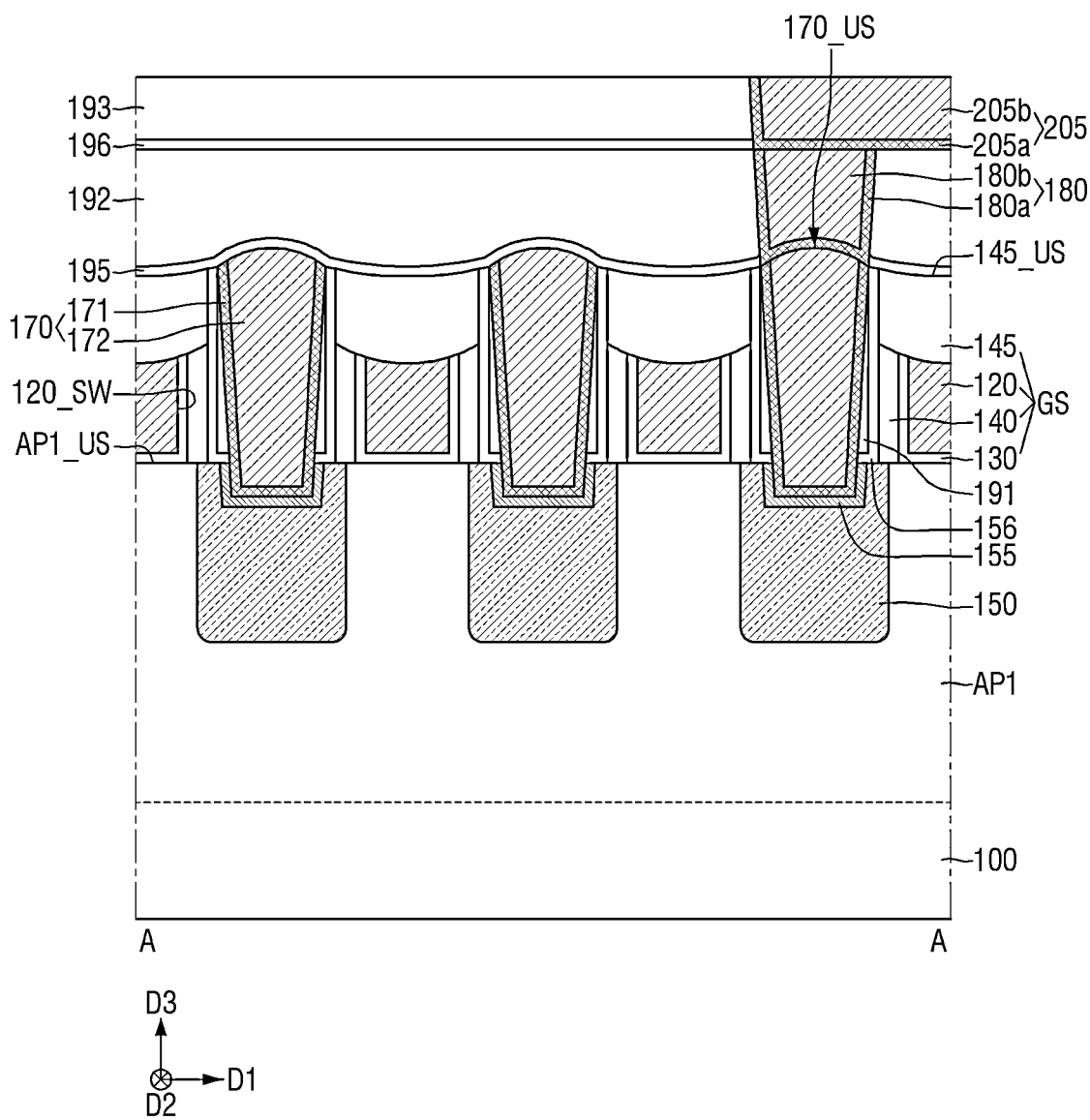
Figure 28:
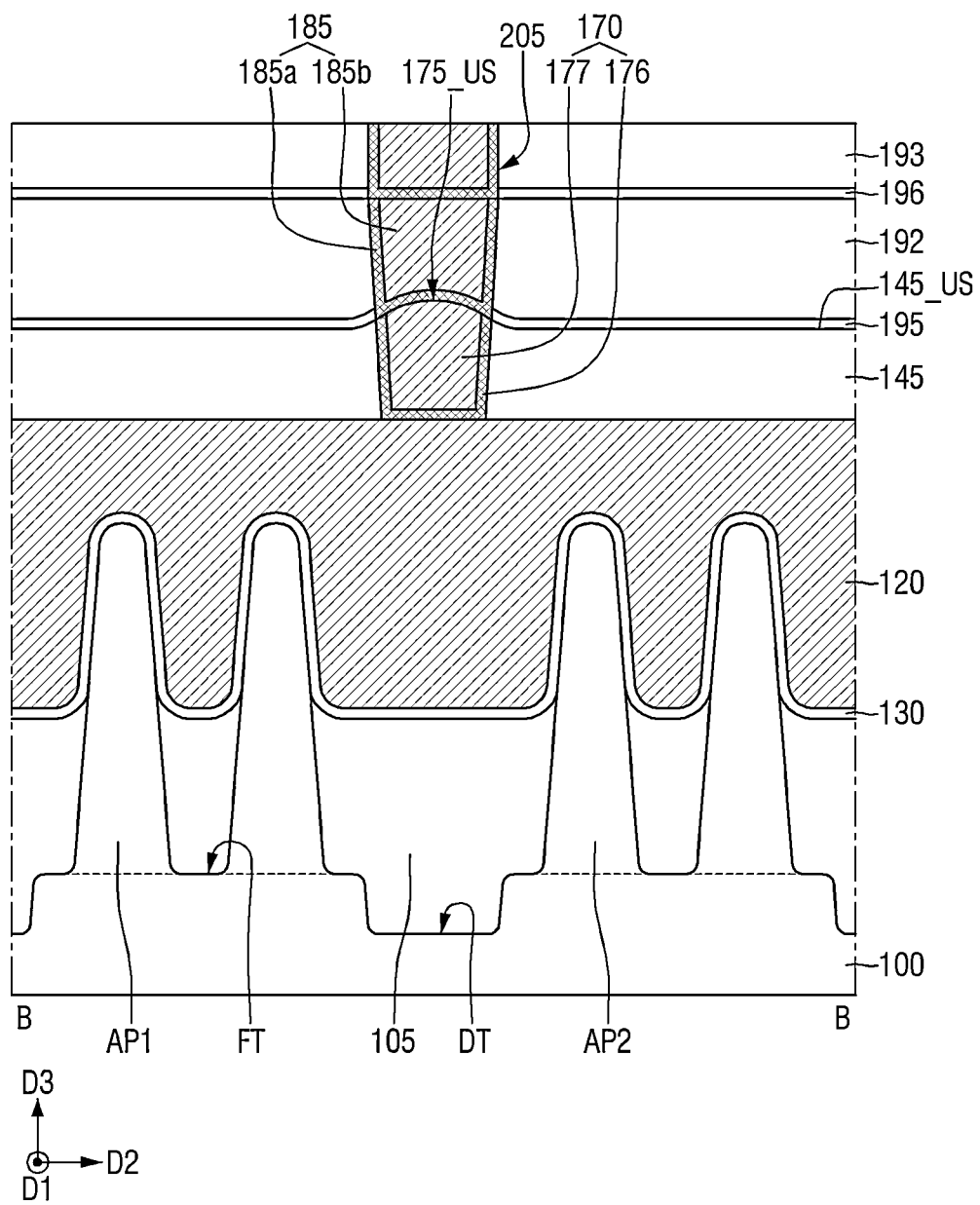
Figure 29:
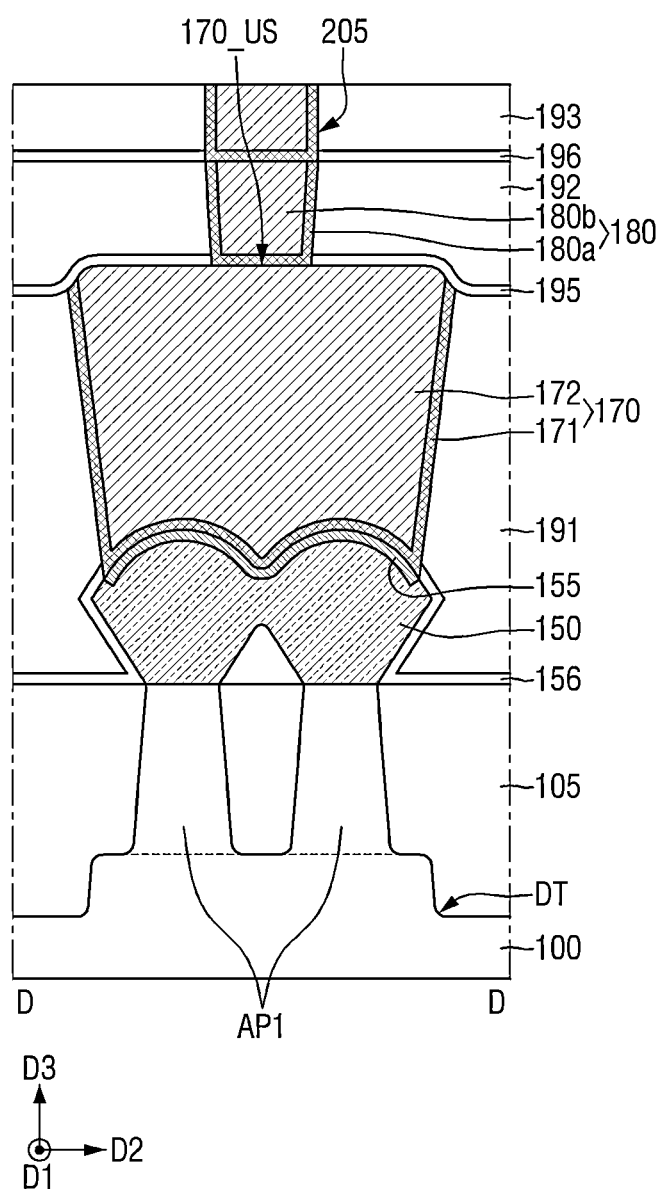

FIGS. 26 to 29 are views illustrating a semiconductor device according to some embodiments. For convenience of description, the following description will be based on a difference from FIGS. 1 to 6. However, the example embodiments are not limited thereto, and may also be directed towards the embodiments included in FIGS. 7 to 25. For reference, FIG. 26 is an example layout view illustrating a semiconductor device according to some embodiments, and FIGS. 27 to 29 are cross-sectional views taken along lines A-A, B-B and D-D of FIG. 26.

Referring to FIGS. 26 to 29, in the semiconductor device according to some embodiments, the first active pattern AP1 and the second active pattern AP2 may be fin-type patterns protruded above the upper surface of the field insulating layer 105.

Each of the first active pattern AP1 and the second active pattern AP2 may be disposed in active areas defined by a deep trench DT. The deep trench DT may define a field area disposed between the active areas.

Two first active patterns AP1 and two second active patterns AP2 are shown as being disposed in the active areas, but the example embodiments are not limited thereto. One first active pattern AP1 and one second active pattern AP2 may be disposed in the active areas, and/or three or more first active patterns AP1 and three or more second active patterns AP2 may be disposed in the active areas.

The first active pattern AP1 disposed in the active area and the second active pattern AP2 disposed in the active area may be separated from each other by a fin trench FT extended to be long in the first direction D1.

Each of the first active pattern AP1 and the second active pattern AP2 may include a semiconductor material, for example, an elemental semiconductor (e.g., silicon and/or germanium), a compound semiconductor (e.g., a group IV-IV compound semiconductor and/or a group III-V compound semiconductor). For example, the first active pattern AP1 and the second active pattern AP2 may include the same material and/or, the first active pattern AP1 may include a material different from that of the second active pattern AP2. When the first active pattern AP1 is disposed in the PMOS forming area and the second active pattern AP2 is disposed in the NMOS forming area, the first active pattern AP1 may be, but is not limited to, a fin-type pattern including silicon-germanium, and the second active pattern AP2 may be, is but not limited to, a fin-type pattern including silicon.

The field insulating layer 105 may be filled in the deep trench DT.

The gate structure GS does not include an inter-gate structure (GS_INT of FIG. 2a).

In FIG. 29, the first source/drain pattern 150 disposed on the first active pattern AP1 may be a connection epitaxial pattern in which two epitaxial patterns are merged. Unlike the shown example, the epitaxial patterns formed on the respective first active patterns AP1 may be separated from each other.

Figure 30:
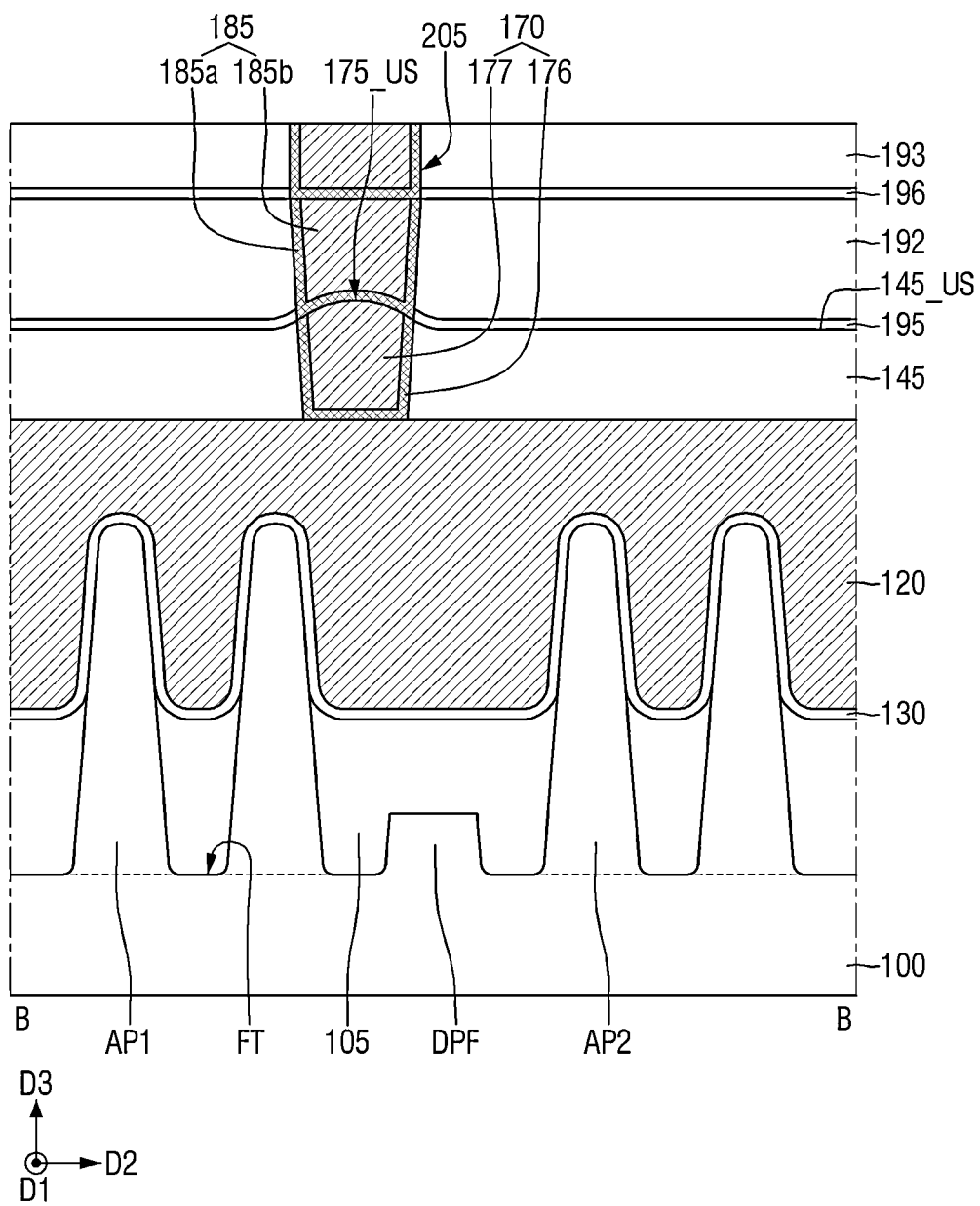
FIG. 30 is a view illustrating a semiconductor device according to some embodiments.

FIG. 30 is a view illustrating a semiconductor device according to some embodiments. For convenience of description, the following description will be based on a difference from FIGS. 26 to 29.

Referring to FIG. 30, in the semiconductor device according to some embodiments, a dummy protrusion pattern DPF may be disposed in a field area that distinguishes the active areas.

The deep trench (DT in FIG. 28) is not formed in the field area. An upper surface of the dummy protrusion pattern DPF is covered by the field insulating layer 105.

Figure 31:
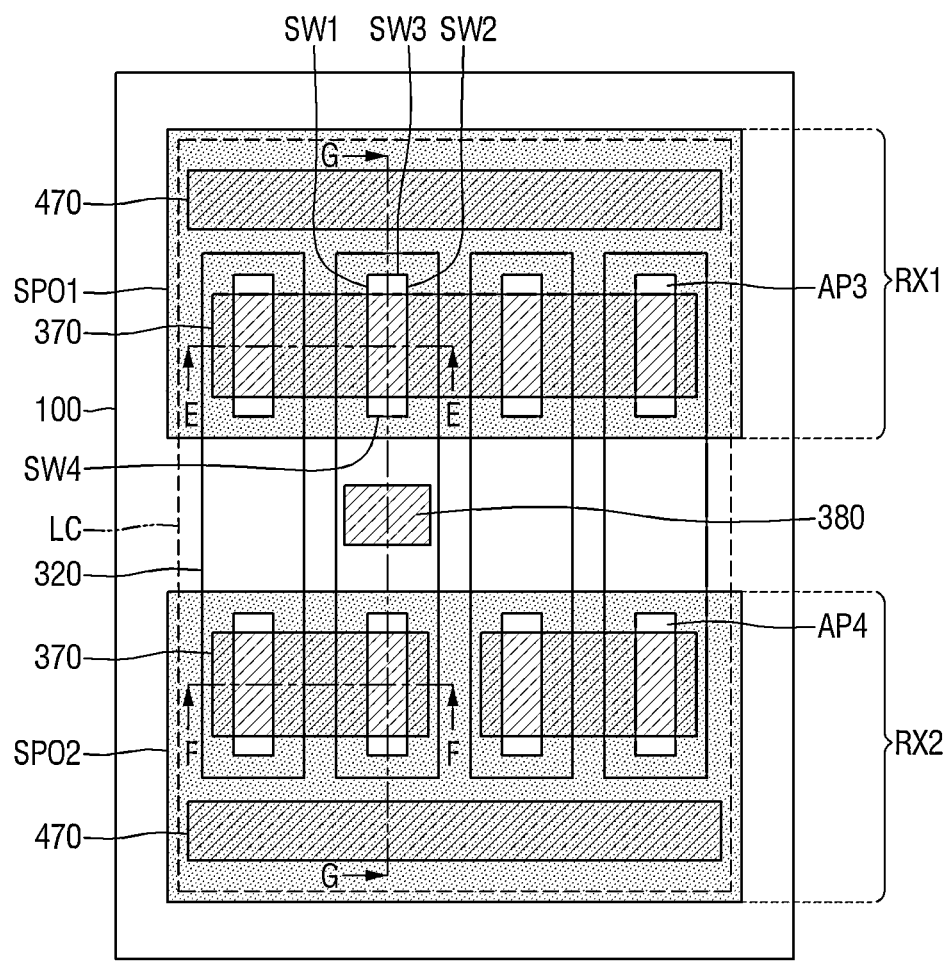
FIGS. 31 to 33 are views illustrating a semiconductor device according to some embodiments.
Figure 32:
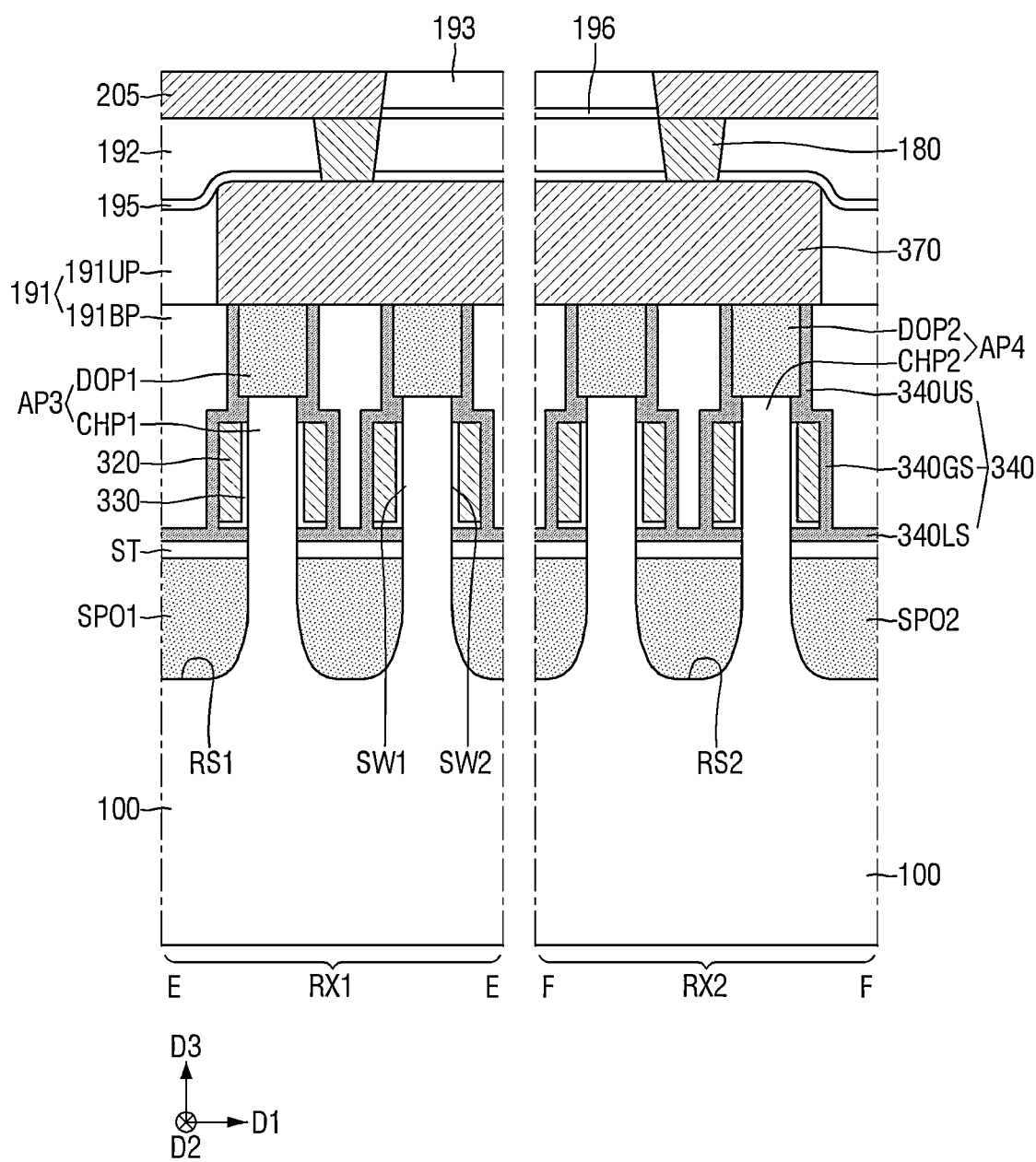
Figure 33:
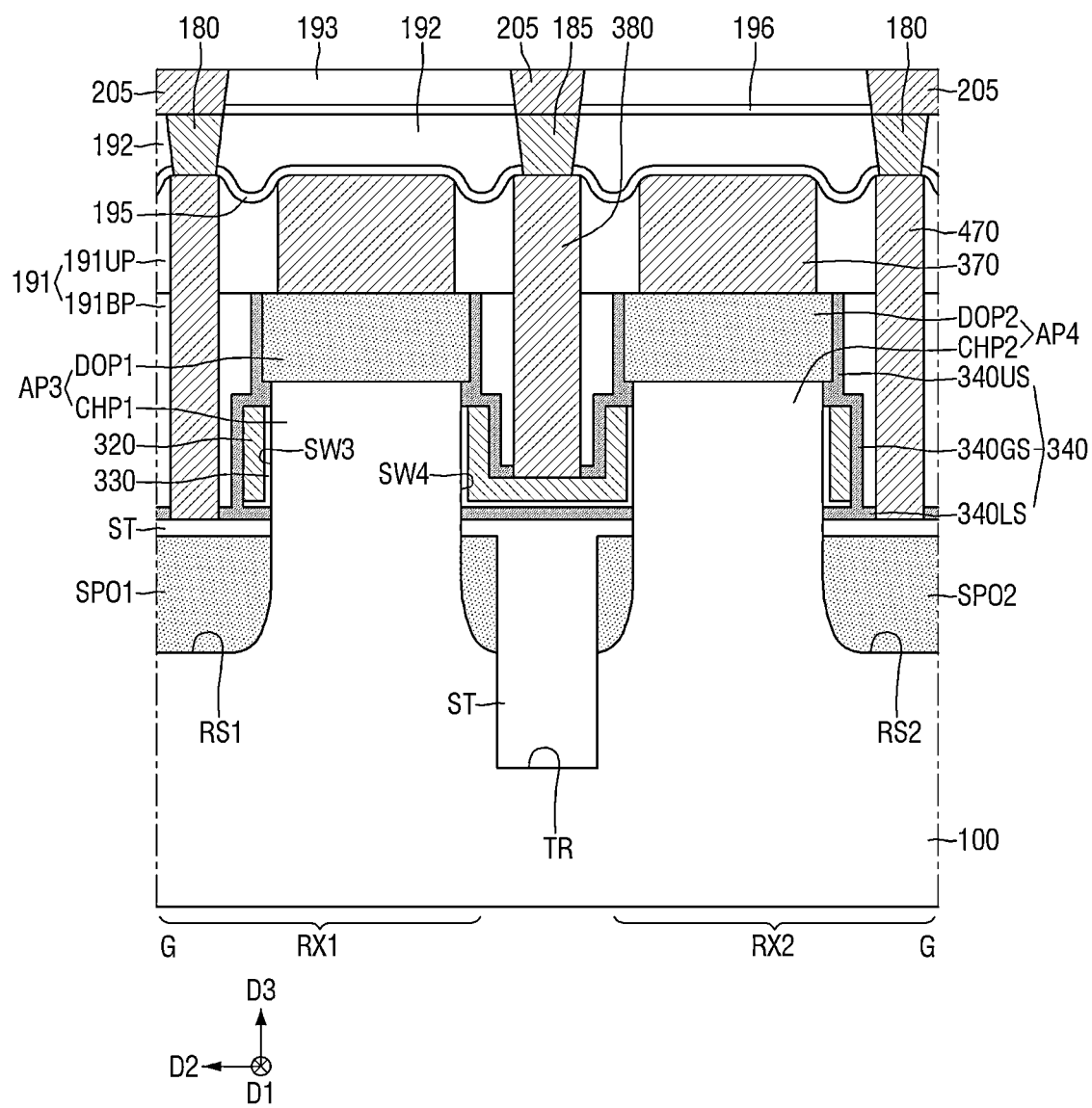

FIGS. 31 to 33 are views illustrating a semiconductor device according to some embodiments. For reference, FIG. 31 is a plan view illustrating a semiconductor device according to some embodiments. FIG. 32 is a cross-sectional view taken along lines E-E and F-F of FIG. 31. FIG. 33 is a cross-sectional view taken along line G-G of FIG. 31.

Referring to FIGS. 31 to 33, a logic cell LC may be provided on the substrate 100. The logic cell LC may refer to a logic element (e.g., inverter, flip-flop, etc.) that performs a specific function. The logic cell LC may include vertical transistors constituting the logic element, and wires connecting the vertical transistors to each other.

The logic cell LC on the substrate 100 may include a first active area RX1 and a second active area RX2. For example, the first active area RX1 may be a positive metal-oxide-semiconductor field effect transistor (PMOSFET) area, and the second active area RX2 may be a negative MOSFET (NMOSFET) area. The first and second active areas RX1 and RX2 may be defined by a trench TR formed on an upper portion of the substrate 100. The first and second active areas RX1 and RX2 may be spaced apart from each other in the second direction D2.

A first lower epi pattern SPO1 may be provided on the first active area RX1, and a second lower epi pattern SPO2 may be provided on the second active area RX2. In a plan view, the first lower epi pattern SPO1 may overlap the first active area RX1, and the second lower epi pattern SPO2 may overlap the second active area RX2. The first and second lower epi patterns SPO1 and SPO2 may be epitaxial patterns formed by a selective epitaxial growth process. The first lower epi pattern SPO1 may be provided in a first recess area RS1 of the substrate 100, and the second lower epi pattern SPO2 may be provided in a second recess area RS2 of the substrate 100.

Third active patterns AP3 may be provided on the first active area RX1, and fourth active patterns AP4 may be provided on the second active area RX2. Each of the third and fourth active patterns AP3 and AP4 may have a fin shape that is vertically protruded. In a plan view, each of the third and fourth active patterns AP3 and AP4 may have a bar shape extended in the second direction D2. The third active patterns AP3 may be arranged along the first direction D1, and the fourth active patterns AP4 may be arranged along the first direction D1.

Each of the third active patterns AP3 may include a first channel pattern CHP1 vertically protruded from the first lower epi pattern SPO1 and a first upper epi pattern DOP1 on the first channel pattern CHP1. Each of the fourth active patterns AP4 may include a second channel pattern CHP2 vertically protruded from the second lower epi pattern SPO2 and a second upper epi pattern DOP2 on the second channel pattern CHP2.

An element isolation layer ST may be provided on the substrate 100 to fill the trench TR. The element isolation layer ST may cover upper surfaces of the first and second lower epi patterns SPO1 and SPO2. The third and fourth active patterns AP3 and AP4 may be protruded vertically above the element isolation layer ST.

A plurality of second gate electrodes 320 extended in parallel with each other in the second direction D2 may be provided on the element isolation layer ST. The second gate electrodes 320 may be arranged along the first direction D1. The second gate electrode 320 may surround the first channel pattern CHP1 of the third active pattern AP3 and may surround the second channel pattern CHP2 of the fourth active pattern AP4. For example, the first channel pattern CH1 of the third active pattern AP3 may have first to fourth sidewalls SW1 to SW4. The first and second sidewalls SW1 and SW2 may face each other in the first direction D1, and the third and fourth sidewalls SW3 and SW4 may face each other in the second direction D2. The second gate electrode 320 may be provided on the first to fourth sidewalls SW1 to SW4. In other words, the second gate electrode 320 may surround the first to fourth sidewalls SW1 to SW4.

A second gate insulating layer 330 may be interposed between the second gate electrode 320 and each of the first and second channel patterns CHP1 and CHP2. The second gate insulating layer 330 may cover a bottom surface of the second gate electrode 320 and an inner sidewall of the second gate electrode 320. For example, the second gate insulating layer 330 may directly cover the first to fourth sidewalls SW1 to SW4 of the third active pattern AP3.

The first and second upper epi patterns DOP1 and DOP2 may be protruded vertically above the second gate electrode 320. An upper surface of the second gate electrode 320 may be lower than a bottom surface of each of the first and second upper epi patterns DOP1 and DOP2. In other words, each of the third and fourth active patterns AP3 and AP4 may have a structure that is vertically protruded from the substrate 100 to pass through the second gate electrode 320.

The semiconductor device according to some embodiments may include vertical transistors in which carriers move in the third direction D3. For example, when a voltage is applied to the second gate electrode 320 so that the transistor is turned "on," the carriers may move from the lower epi patterns SPO1 and SPO2 to the upper epi patterns DOP1 and DOP2 through the channel patterns CHP1 and CHP2. In the semiconductor device according to some embodiments, the second gate electrode 320 may completely surround the sidewalls SW1 to SW4 of the channel patterns CHP1 and CHP2. The transistor according to the present disclosure may be a three-dimensional field effect transistor (e.g., vertical FET (VFET)) having a gate all around structure. Since a gate surrounds a channel, the semiconductor device according to some embodiments may have excellent electrical characteristics.

A spacer 340 covering the second gate electrodes 320 and the third and fourth active patterns AP3 and AP4 may be provided on the element isolation layer ST. The spacer 340 may include an insulating material layer such as a silicon nitride layer and/or a silicon oxynitride layer. The spacer 340 may include a lower spacer 340LS, an upper spacer 340US, and a gate spacer 340GS between the lower and upper spacers 340LS and 340US.

The lower spacer 340LS may directly cover an upper surface of the element isolation layer ST. The second gate electrodes 320 may be spaced apart from the element isolation layer ST in the third direction D3 by the lower spacer 340LS. The gate spacer 340GS may cover an upper surface and an outer sidewall of each of the second gate electrodes 320. The upper spacer 340 may cover the first and second upper epi patterns DOP1 and DOP2. However, the upper spacer 340US may expose upper surfaces of the first and second upper epi patterns DOP1 and DOP2 without covering the upper surfaces of the first and second upper epi patterns DOP1 and DOP2.

A first lower interlayer insulating layer 191BP may be provided on the spacer 340. An upper surface of the first lower interlayer insulating layer 191BP may be substantially coplanar with the upper surfaces of the first and second upper epi patterns DOP1 and DOP2. A first upper interlayer insulating layer 191UP, the lower etch stop layer 195, the second interlayer insulating layer 192, the upper etch stop layer 196, and the third interlayer insulating layer 193 may sequentially be deposited on the first lower interlayer insulating layer 191BP. The first lower interlayer insulating layer 191BP and the first upper interlayer insulating layer 191UP may be included in the first interlayer insulating layer 191. The first upper interlayer insulating layer 191UP may cover the upper surfaces of the first and second upper epi patterns DOP1 and DOP2.

At least one first vertical source/drain contact 370 connected to the first and second upper epi patterns DOP1 and DOP2 by passing through the first upper interlayer insulating layer 191UP may be provided. At least one second vertical source/drain contact 470 connected to the first and second lower epi patterns SPO1 and SPO2 by sequentially passing through the first interlayer insulating layer 191, the lower spacer 340LS and the element isolation layer ST may be provided. A vertical gate contact 380 connected to the second gate electrode 320 by sequentially passing through the first upper interlayer insulating layer 191UP, the first lower interlayer insulating layer 191BP and the gate spacer 340GS may be provided.

The lower etch stop layer 195, the second interlayer insulating layer 192, and the upper etch stop layer 196 may be disposed between the first upper interlayer insulating layer 191UP and/or the third interlayer insulating layer 193.

The source/drain via plug 180 and the gate via plug 185 may be provided in the lower etch stop layer 195 and the second interlayer insulating layer 192. The wiring line 205 may be provided in the third interlayer insulating layer 193 and the upper etch stop layer 196. Although the first vertical source/drain contact 370, the second vertical source/drain contact 470, the source/drain via plug 180, the gate via plug 185 and the wiring line 205 are shown as a single layer, this is only for convenience of description and the example embodiments are not limited thereto.

The description of the first vertical source/drain contact 370, the second vertical source/drain contact 470 and the vertical gate contact 380 may be substantially the same as that of the source/drain contact 170 and the gate contact 175, which are described with reference to FIGS. 1 to 30.

FIGS. 34 to 38 are views illustrating intermediate steps to describe a method of manufacturing a semiconductor device according to some embodiments. For reference, FIGS. 34 to 38 may be cross-sectional views taken along line A-A of FIG. 1. Hereinafter, the method of manufacturing a semiconductor device will be described in view of a cross-sectional view.

Figure 34:
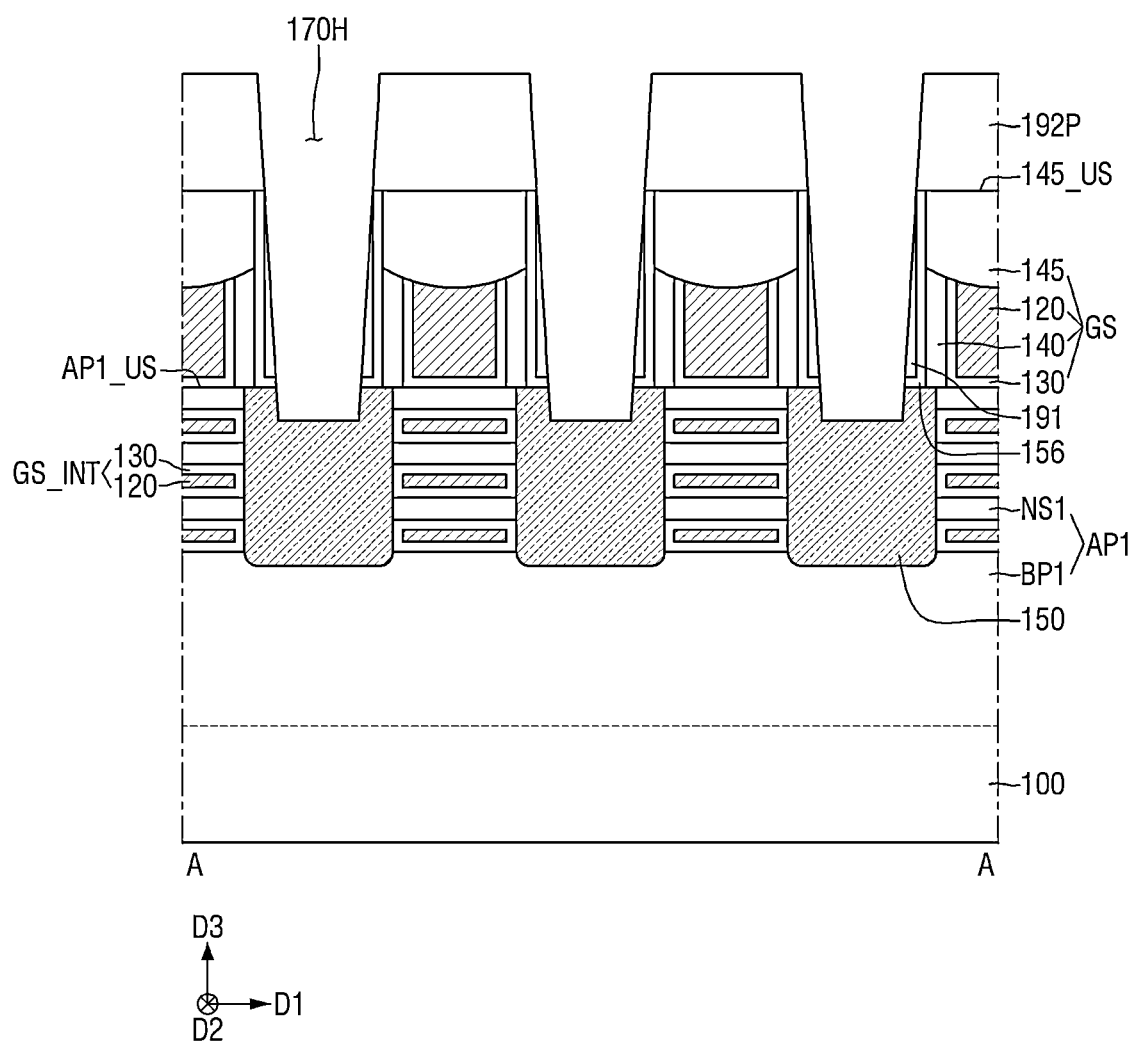
FIGS. 34 to 38 are views illustrating intermediate steps to describe a method of manufacturing a semiconductor device according to some embodiments.

Referring to FIG. 34, a first source/drain pattern 150 may be formed on a first lower pattern BP1. A source/drain etch stop layer 156 and a first interlayer insulating layer 191 may sequentially be formed on the first source/drain pattern 150.

After a first interlayer insulating layer 191 is formed, a first sheet pattern NS1 spaced apart from the first lower pattern BP1 may be formed. A sacrificial layer and an active layer are alternately deposited on the first lower pattern BP1, and then the sacrificial layer is removed, whereby the first sheet pattern NS1 may be formed.

A first gate insulating layer 130 and a first gate electrode 120, which surround the first sheet pattern NS1, may be formed. A gate capping pattern 145 may be formed on the first gate electrode 120. As a result, a gate structure GS crossing the first active pattern AP1 is formed on the first active pattern AP1.

Subsequently, a sacrificial interlayer insulating layer 192P may be formed on the gate structure GS and the first interlayer insulating layer 191.

An upper surface 145_US of the gate capping pattern 145 before the sacrificial interlayer insulating layer 192P is formed may be a flat plane. Also, the upper surface 145_US of the gate capping pattern 145 may be coplanar with an upper surface of the first interlayer insulating layer 191.

Then, a source/drain contact hole 170H may be formed in the sacrificial interlayer insulating layer 192P and the first interlayer insulating layer 191. The source/drain contact hole 170H exposes the first source/drain pattern 150.

Figure 35:
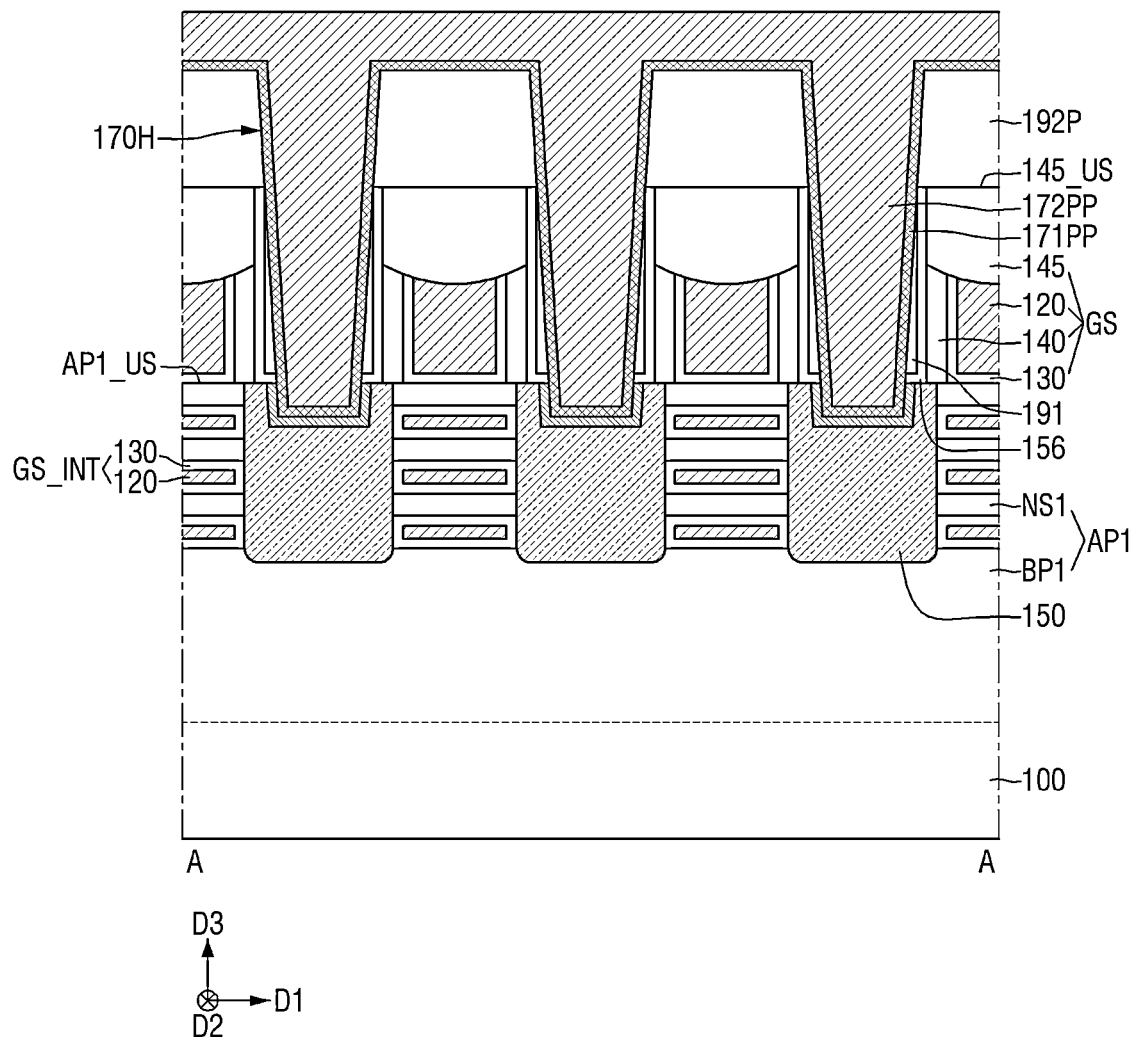

Referring to FIG. 35, a barrier layer 171PP may be formed along an upper surface of the sacrificial interlayer insulating layer 192P and a sidewall and a bottom surface of the source/drain contact hole 170H.

A filling layer 172PP is formed on the barrier layer 171PP to fill the source/drain contact holes 170H. A portion of the filling layer 172PP may be disposed on the upper surface of the sacrificial interlayer insulating layer 192P.

For example, before the barrier layer 171PP is formed, a first silicide layer 155 may be formed and/or the first silicide layer 155 may be formed through a silicide reaction between the first source/drain pattern 150 and the barrier layer 171PP.

Figure 36:
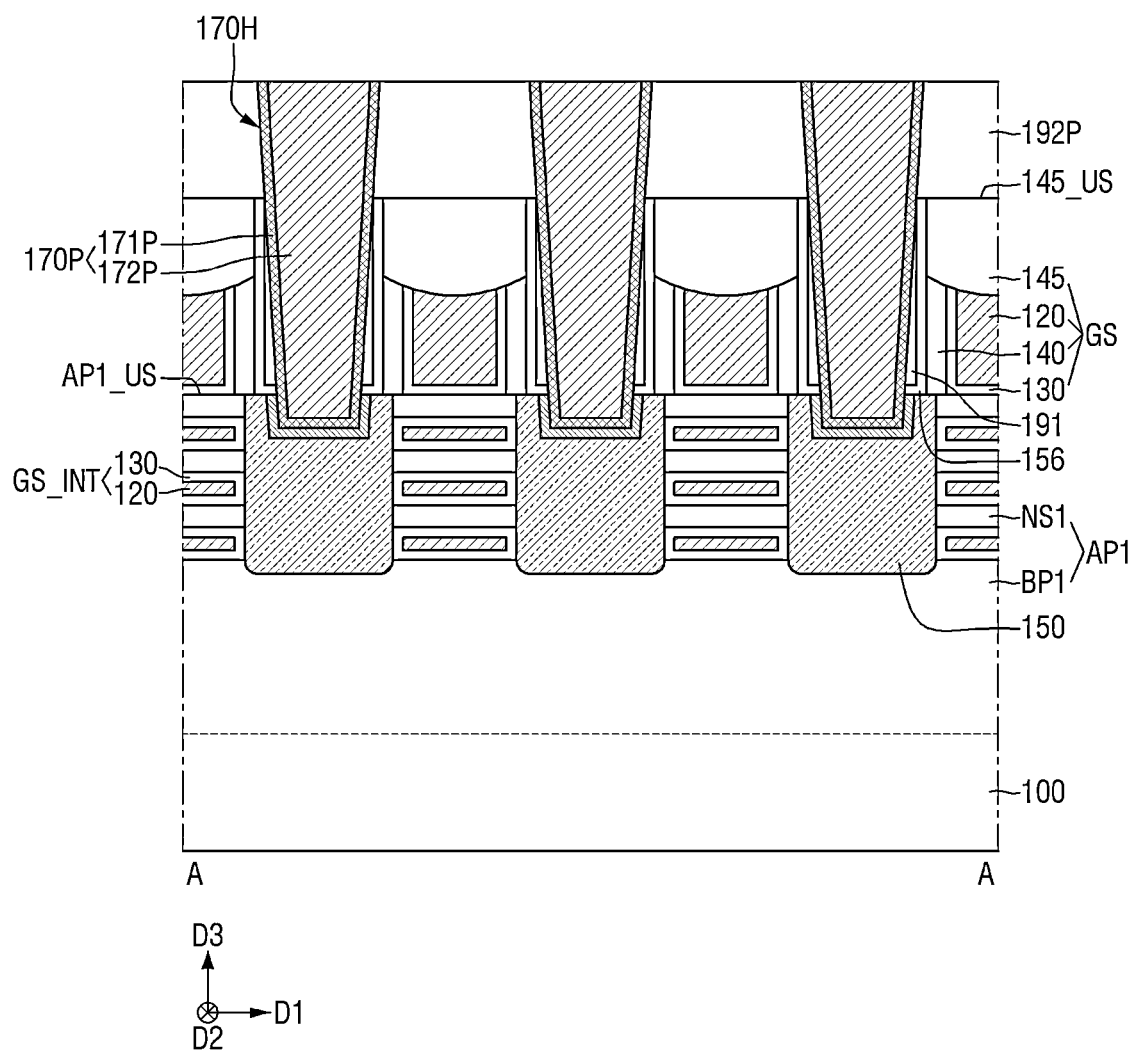

Referring to FIG. 36, the filling layer 172PP and the barrier layer 171PP, which are disposed on the upper surface of the sacrificial interlayer insulating layer 192P, may be removed.

As a result, a pre-source/drain contact 170P may be formed in the source/drain contact hole 170H. The free source/drain contact 170P may include a pre-source/drain barrier layer 171P and a pre-source/drain filling layer 172P.

Figure 37:
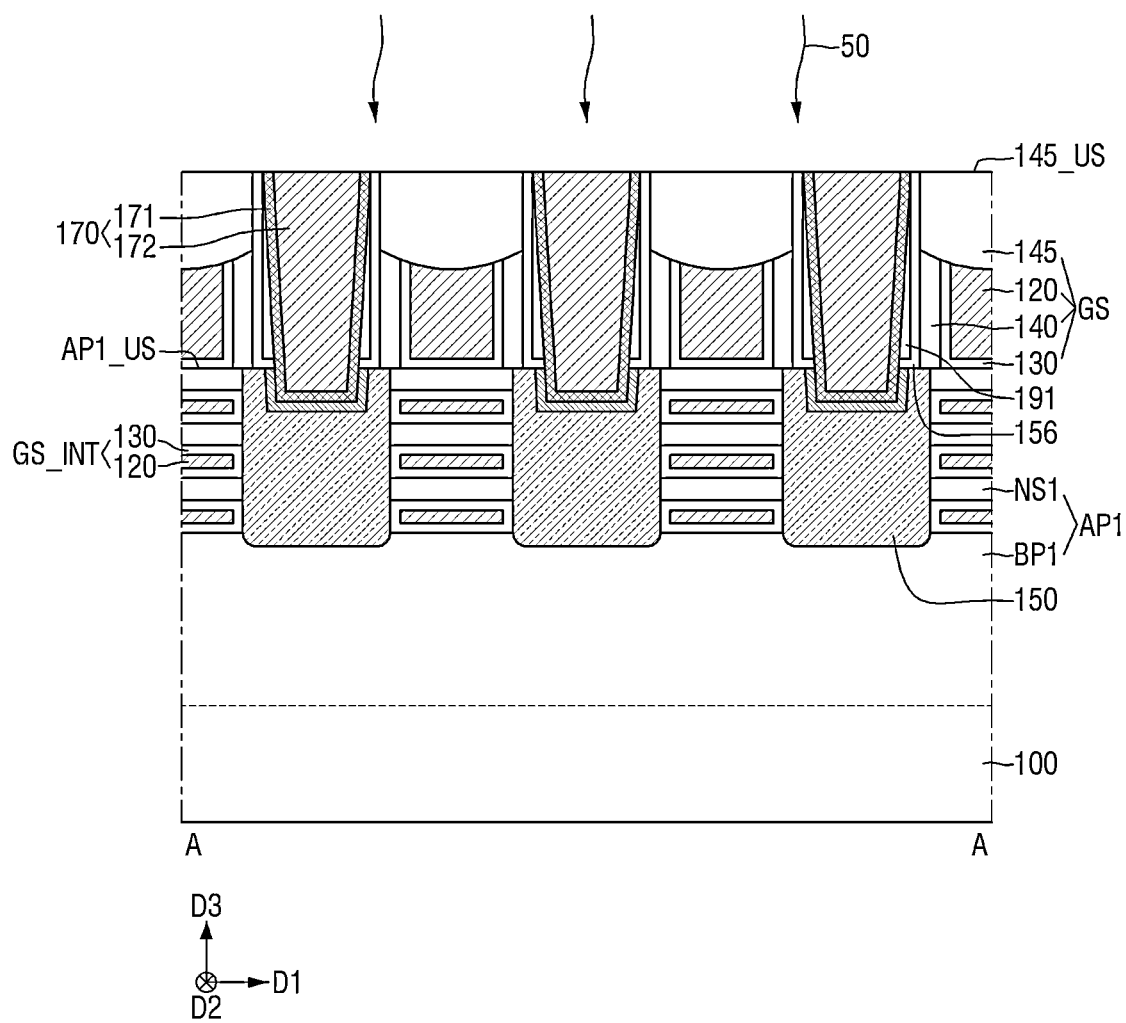

Referring to FIG. 37, a source/drain contact 170 may be formed, e.g., through a first chemical mechanical polishing (CMP) process 50.

For example, the first CMP process 50 may be performed until the gate capping pattern 145 is exposed. A slurry used for the first CMP process 50 may have characteristics of uniformly polishing the pre-source/drain contact 170P and the sacrificial interlayer insulating layer 192P.

For example, after the first CMP process 50 is performed, the upper surface 145_US of the gate capping pattern may be placed on the same plane as that of the source/drain contact 170. The source/drain contact 170 is not more protruded in the third direction D3 than the upper surface 145_US of the gate capping pattern.

Figure 38:
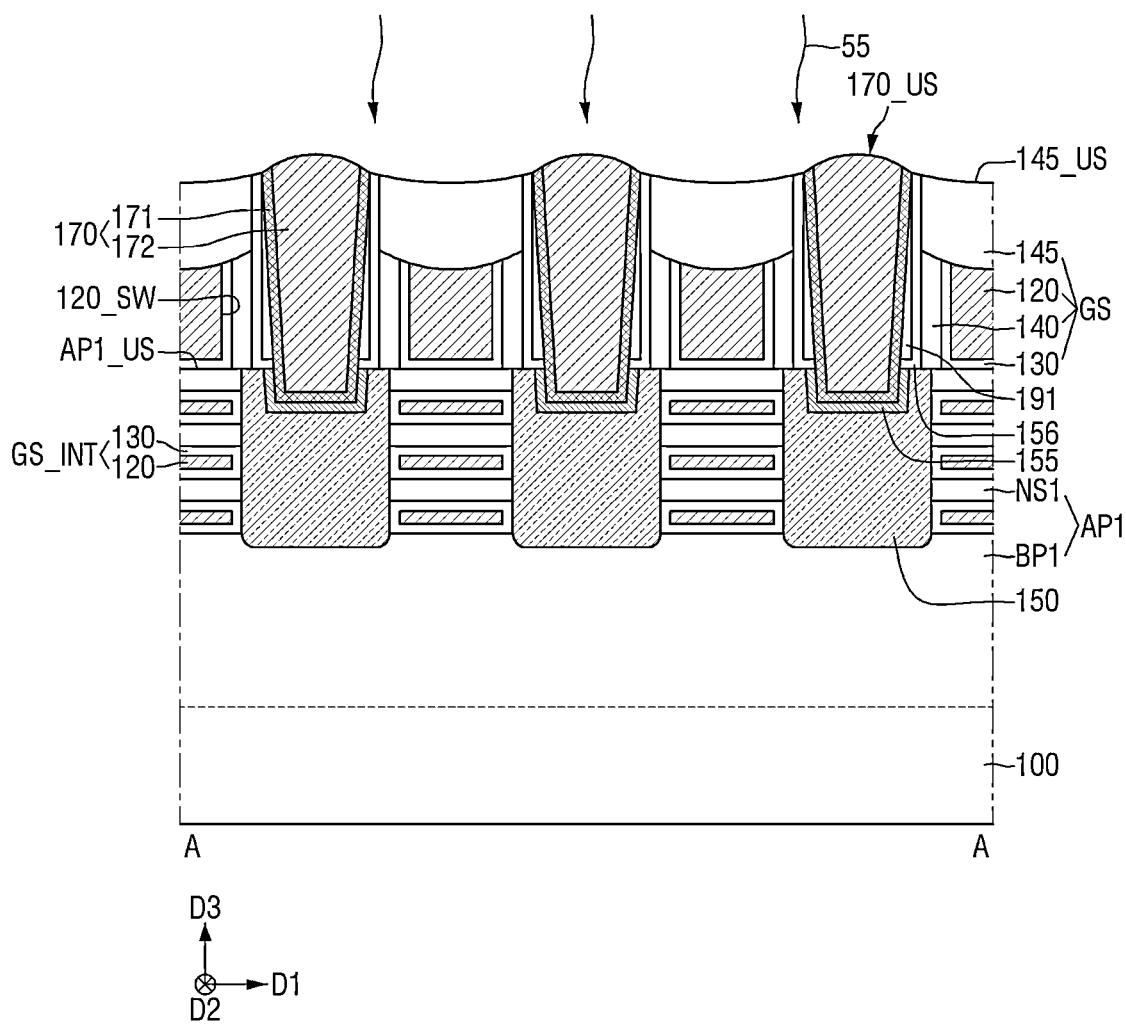

Referring to FIG. 38, a portion of the source/drain contact 170 may be more protruded in the third direction D3 than the upper surface 145_US of the gate capping pattern through a second CMP process 55.

After the second CMP process 55 is performed, an upper surface 170_US of the source/drain contact may include a convex curved surface.

A slurry used for the second CMP process 55 may polish the gate capping pattern 145 and the first interlayer insulating layer 191 more than the source/drain contact 170. Therefore, a portion of the source/drain contact 170 may be more protruded than the upper surface 145_US of the gate capping pattern. Also, an upper surface of a portion of the source/drain contact 170, which is adjacent to the gate capping pattern 145, may be changed to a convex curved surface.

A shape of the upper surface 145_US of the gate capping pattern may be changed by adjusting the slurry used for the second CMP process 55.

Although not shown, for example, after a pre-gate contact is formed, a gate contact (175 of FIG. 3) may be formed while the first CMP process (50 of FIG. 37) is being performed. Then, a portion of the gate contact 175 may be more protruded than the upper surface 145_US of the gate capping pattern through the second CMP process 55.

For another example, after the source/drain contact 170 is formed, the pre-gate contact may be formed. Then, the gate contact 175 may be formed through the first CMP process 50.

For still another example, before the pre-source/drain contact 170P is formed, the gate contact 175 may be formed. The gate contact 175 may be formed through a process similar to that described with reference to FIGS. 34 to 37.

For further another example, after the source/drain contact 170 having a convex upper surface is formed, the gate contact 175 may be formed. For example, an additional first interlayer insulating layer (e.g., 191 of FIG. 18) may be formed on the gate capping pattern 145 and the first interlayer insulating layer 191. The additional interlayer insulating layer may cover the protruded portion of the source/drain contact 170. Subsequently, the pre-gate contact may be formed through a process similar to that described with reference to FIGS. 34 to 36. Then, the first CMP process (50 of FIG. 37) may be performed until the source/drain contact 170 is exposed, whereby the gate contact 175 may be formed. As a result, the semiconductor device described with reference to FIGS. 18 and 19 may be formed.

In concluding the detailed description, those skilled in the art will appreciate that many variations and modifications may be made to the example embodiments without substantially departing from the principles of the present inventive concepts. Therefore, the disclosed example embodiments of the invention are used as examples and in for purposes of description only and not for purposes of limitation.

What is claimed is:

1. A semiconductor device comprising:
   a gate structure including a gate electrode and a gate capping pattern on an upper surface of the gate electrode in a first direction, and an upper surface of the gate capping pattern includes a concave curved surface;
   a source/drain pattern on at least one side of the gate structure;
   a source/drain contact on and connected with an upper surface of the source/drain pattern, the source/drain contact extending along a sidewall of the gate electrode; and
   an etch stop layer disposed on the source/drain contact, wherein an upper surface of the source/drain contact includes a convex curved surface, and wherein the convex curved surface includes a linear portion in a cross-section of the convex curved surface defined by the first direction and a second direction perpendicular to the first direction, a first portion of the linear portion contacts an insulating layer disposed thereon and a second portion of the linear portion contacts a conducting layer disposed thereon, the etch stop layer is continuously disposed on the convex curved surface of the upper surface of the source/drain contact and the concave curved surface of the gate capping pattern.

2. The semiconductor device of claim 1, wherein a portion of the source/drain contact protrudes above an upper surface of the gate capping pattern.

3. The semiconductor device of claim 2, wherein
the source/drain contact includes a source/drain filling layer and a source/drain barrier layer extended along a sidewall of the source/drain filling layer, and
the source/drain filling layer and the source/drain barrier layer protrude above the upper surface of the gate capping pattern.

4. The semiconductor device of claim 2, wherein
the source/drain contact includes a source/drain filling layer and a source/drain barrier layer extended along a sidewall of the source/drain filling layer,
a portion of the source/drain filling layer protrudes above the upper surface of the gate capping layer, and
the source/drain barrier layer is below the upper surface of the gate capping pattern.

5. The semiconductor device of claim 1, further comprising:
a gate contact passing through the gate capping pattern and connecting with the gate electrode,
wherein an upper surface of the gate contact includes a convex curved surface.

6. The semiconductor device of claim 1, wherein
the source/drain contact includes a source/drain filling layer, and
an upper surface of the source/drain filling layer is included in the upper surface of the source/drain contact including the convex curved surface.

7. The semiconductor device of claim 6, wherein the source/drain contact further includes a source/drain barrier layer extended along a sidewall of the source/drain filling layer.

8. The semiconductor device of claim 1, wherein the upper surface of the source/drain contact includes a third portion having the convex curved surface and a fourth portion having a concave curved surface.

9. A semiconductor device comprising:
a gate structure including a gate electrode and a gate capping pattern on an upper surface of the gate electrode;
a source/drain pattern on at least one side of the gate structure; and
a source/drain contact on and connected with an upper surface of the source/drain pattern,
wherein at least a portion of the source/drain contact protrudes above an upper surface of the gate capping pattern directly above the gate structure, and uppermost portion of the upper surface of the gate capping pattern has a concave curved surface.

10. The semiconductor device of claim 9, wherein an upper surface of the source/drain contact includes a convex curved surface.

11. The semiconductor device of claim 9, wherein an upper surface of the source/drain contact includes a first portion having a convex curved surface and a second portion having a concave curved surface.

12. The semiconductor device of claim 9, wherein
source/drain contact includes a source/drain filling layer and a source/drain barrier layer extending along a sidewall of the source/drain filling layer,
at least a portion of the source/drain filling layer and the source/drain barrier layer protrude above the upper surface of the gate capping pattern, and
at least a portion of the source/drain filling layer protrudes above an upper surface of the source/drain barrier layer.

13. The semiconductor device of claim 9, further comprising:
a gate contact passing through the gate capping pattern and connecting with the gate electrode,
wherein an upper surface of the gate contact includes a convex curved surface.

14. The semiconductor device of claim 9, wherein a central portion of the upper surface of the gate capping pattern includes the concave curved surface.

15. A semiconductor device comprising:
an active pattern including a lower pattern and a sheet pattern on the lower pattern, and an upper surface of the gate capping pattern includes a concave curved surface;
a gate structure on the active pattern, the gate structure including a gate electrode and a gate capping pattern, the gate electrode surrounding the sheet pattern, and the gate capping pattern on an upper surface of the gate electrode;
a source/drain pattern on at least one side of the gate structure;
a source/drain contact on and connected with an upper surface of the source/drain pattern;
a gate contact passing through the gate capping pattern and connecting with the gate electrode; and
an etch stop layer disposed on the source/drain contact,
wherein a portion of the source/drain contact and a portion of the gate contact protrude above an upper surface of the gate capping pattern directly above the gate electrode,
an uppermost surface of the source/drain contact includes a convex curved surface, and
the etch stop layer is continuously disposed on the convex curved surface of the upper surface of the source/drain contact and the concave curved surface of the gate capping pattern.

16. The semiconductor device of claim 15, wherein
the source/drain contact includes a source/drain filling layer and a source/drain barrier layer extended along a sidewall of the source/drain filling layer, and
a portion of the source/drain filling layer and a portion of the source/drain barrier layer protrude above the upper surface of the gate capping pattern.

17. The semiconductor device of claim 15, wherein
the gate contact includes a gate contact filling layer and a gate contact barrier layer extending along a sidewall of the gate contact filling layer, and
the gate contact filling layer and the gate contact barrier layer protrude above the upper surface of the gate capping pattern.

* * * * *